United States Patent
Shen

(10) Patent No.: US 7,970,811 B2
(45) Date of Patent: Jun. 28, 2011

(54) CONTINUOUS-TIME MULTI-GIGAHERTZ FILTER USING TRANSMISSION LINE DELAY ELEMENTS

(76) Inventor: David H. Shen, Saratoga, CA (US)

( * ) Notice: Subject to any disclaimer, the term of this patent is extended or adjusted under 35 U.S.C. 154(b) by 1561 days.

(21) Appl. No.: 10/810,603

(22) Filed: Mar. 29, 2004

(65) Prior Publication Data

US 2004/0196085 A1    Oct. 7, 2004

Related U.S. Application Data

(60) Provisional application No. 60/460,679, filed on Apr. 4, 2003.

(51) Int. Cl.
G06G 7/02     (2006.01)

(52) U.S. Cl. ....................................... 708/819

(58) Field of Classification Search .................. 708/320, 708/819
See application file for complete search history.

(56) References Cited

U.S. PATENT DOCUMENTS

| | | | | |
|---|---|---|---|---|
| 3,624,562 A | * | 11/1971 | Fujimura | 333/18 |
| 5,055,795 A | * | 10/1991 | Kasper et al. | 330/54 |
| 5,212,659 A | | 5/1993 | Scott | |
| 5,225,798 A | | 7/1993 | Hunsinger | |
| 5,682,125 A | * | 10/1997 | Minuhin et al. | 333/18 |
| 6,268,815 B1 | | 7/2001 | Gustavsson | |
| 6,563,373 B1 | * | 5/2003 | Shou et al. | 327/554 |
| 7,075,363 B1 | * | 7/2006 | Thon | 327/552 |
| 2004/0193669 A1 | * | 9/2004 | Shirani | 708/819 |

OTHER PUBLICATIONS

Oppenheim et al., "Discrete-Time Signal Processing," Prentice Hall, USA, 1989, pp. 300-328.
Gregorian et. al., "Switched-Capacitor Circuit Design," Proceedings of IEEE, vol. 71, No. 8, USA, pp. 941-966, Aug. 1983.
Castello et al., "Performance Limitations in Switched-Capacitor Filters," IEEE Transactions on Circuits and Systems, vol. CAS-32,No. 9, USA, pp. 865-876, Sep. 1985.
Martin et. al., "Effects of the Op Amp Finite Gain and Bandwidth on the Performance of Switched-Capacitor Filters," IEEE Transactions on Circuits and Systems, vol. CAS-28, No. 8, USA, pp. 822-829, Aug. 1981.
Koli et. al., "A fully differential class-AB switched-current integrator for signal processing," IEEE Journal of Solid-State Circuits, vol. 32, No. 2 , USA, Feb. 1997, pp. 238-244.
Muhammad et. al., "A Discrete-Time Bluetooth Receiver in a 0.13um Digital CMOS Process," Proceedings of the 2004 IEEE International Solid-State Circuits Conference, USA, pp. 268-269.

* cited by examiner

Primary Examiner — Tan V Mai

(57)    ABSTRACT

An analog equalization filter is disclosed which permits higher speed and linearity than existing designs, allowing for filtering operation to the hundreds of gigahertz range. Possible applications include fixed and adaptive equalization filtering and radio frequency filtering. The filter can be entirely implemented on an integrated circuit chip. The filter is based on transmission line based delay elements and transconductance amplifiers.

11 Claims, 16 Drawing Sheets

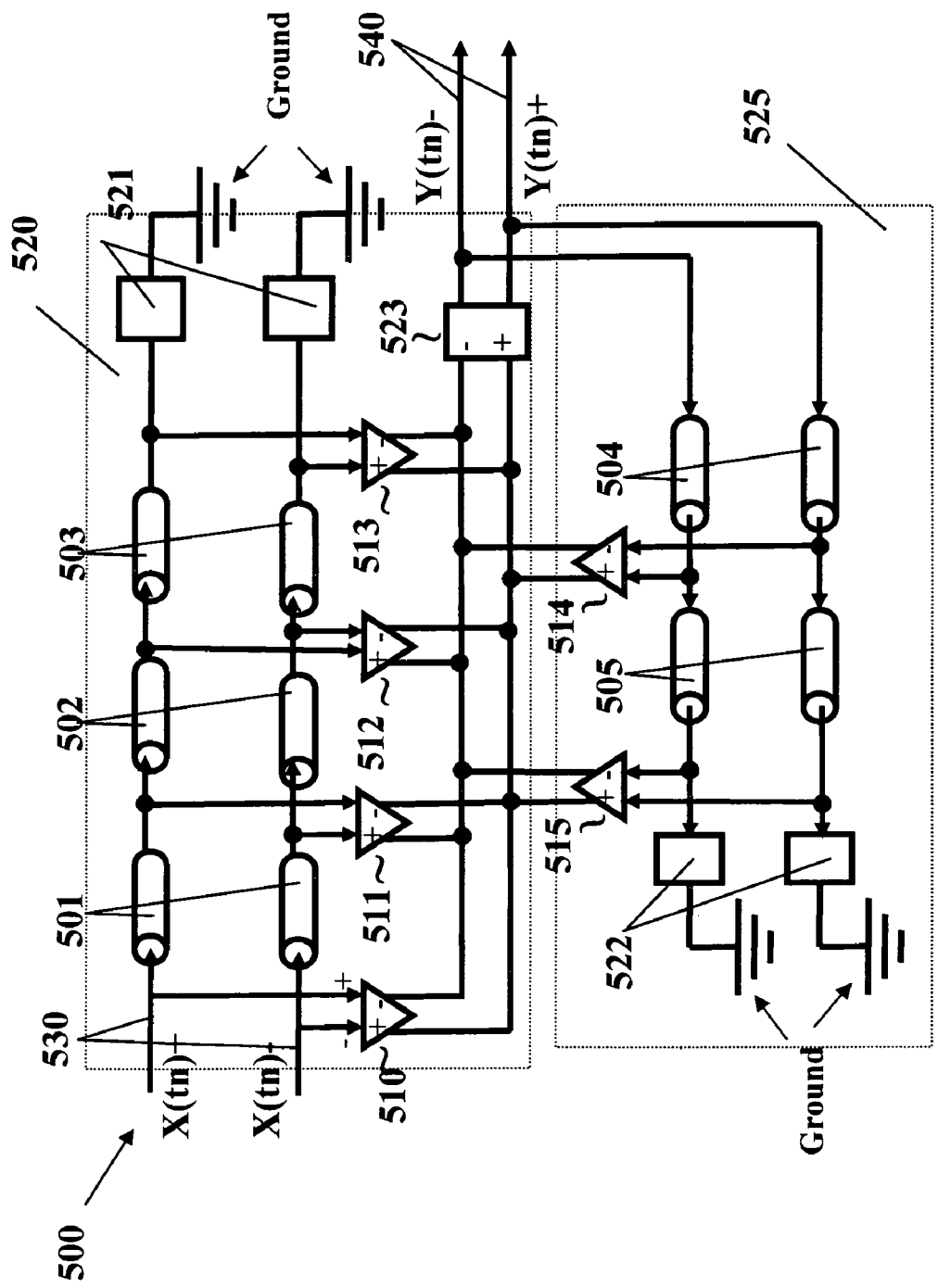

CONTINUOUS-TIME MULTI-GIGAHERTZ FILTER USING TRANSMISSION LINE DELAY ELEMENTS

CROSS-REFERENCE TO RELATED APPLICATIONS

This application claims the benefit of priority from U.S. Provisional Application entitled "Continuous-Time Multi-Gigahertz Filter Using Transmission Line Delay Elements" Application No. 60/460,679 filed on Apr. 4, 2003.

BACKGROUND

1. Technical Field of Invention

This present invention relates to analog implementations of finite impulse response (FIR) filters and infinite impulse response (IIR) filters. The filter application examples include but are not limited to equalization of 10 Gb/s and 40 Gb/s fiber optic transmission systems, multi-gigahertz serial chip-to-chip communications, multi-gigahertz serial backplane communications, high-speed network communications, disk drive channel equalization, and filtering for radio frequency (RF) systems. Additionally, the FIR and IIR filter coefficients can be programmed so as to form an adaptive equalizer.

2. Background of the Invention and Discussion of Prior Art

A FIR or IIR filter is a basic building block of digital filtering systems. Typically for low frequency filtering (less than 100 MHz), as in modems, FIR or IIR filtering can be done with a DSP processor or ASIC using CMOS digital logic. At higher speeds, between 10 MHz and 1 GHz, a digital filtering solution will dissipate very high power and requires large die area, and a CMOS analog solution becomes attractive in order to reduce power and area. However, at speeds of 1 GHz and above, both digital and analog solutions become problematic even in higher speed technologies such as SiGe, InP, and GaAs.

A block diagram of a typical FIR filter structure 100 is shown in FIG. 1. The FIR filter consists of delay line elements, 101, 102, and 103, coefficients A, B, C, and D, coefficient multipliers, 104, 105, 106, and 107, and a summing circuit, 8. The input, X, is successively passed through the fixed delay elements, 101, 102, and 103. The signals at the successful nodes of the delay elements 101, 102, and 103 are then multiplied by coefficients A, B, C, and D, respectively, before being summed to produce the output, Y. Prior art analog implementations of FIR filters have been published in the literature using switched-capacitor filtering to implement delay elements, multipliers, and summers. Unfortunately, switched-capacitor circuits are limited in speed by the gain-bandwidth product of the operation amplifiers, which is limited by the speed of the technology. Higher gain gives better linearity performance, yet requires the speed to be reduced.

Hence, there is also a severe speed versus linearity tradeoff in traditional designs. Other methods for implementing these types of filters exist, but all share high frequency performance limitations.

OBJECTS AND ADVANTAGES OF THE INVENTION

Accordingly, it is a primary object of the present invention to provide an analog FIR and IIR filter implementation that improves upon the speed of current implementations into the hundreds of gigahertz range with superior linearity to the implementations of the prior art.

SUMMARY OF THE INVENTION

The present invention achieves the above objectives and advantages by taking advantage of the properties of transmission lines. A transmission line provides a fixed impedance value over a wide range of frequencies with excellent linearity. This easily includes ranges up to and exceeding 100 GHz. In addition, the propagation delay of signals propagating down a transmission line can be precisely controlled only by the dimensions of the transmission line and the physical properties of the medium in which the transmission line is built. The inventor notes that these properties of the transmission line make it an ideal element for the delay stages of the FIR filter and are not subject to the linearity/bandwidth limitations of active delay stages.

In general, implementations feature an analog filter circuit. The analog filter include a transmission line delay element and a transconductance element as a building block for fiber optic transmission systems, multi-gigahertz serial chip-to-chip communications, multi-gigahertz serial backplane communications, high-speed network communications, disk drive channel equalization, and filtering for radio frequency (RF) systems. In general, the transmission line delay element has a delay time and time-delays an input signal. The transmission delay line is terminated with a matched or mismatched impedance element according to the filter response requirement. In general, the transconductance element multiplies the time-delayed input signal by a tunable filter coefficient then converts the multiplied time-delayed input signal to a current. The analog filtering is performed by the multiplication function of the transconductance elements. A number of multiplied time-delayed input signals by different delay times of the transmission delay lines are converted to currents by the transconductance elements. The outputs of the transconductance elements couple together to form a current summing node to sum the multiplied or amplified different time-delayed currents into a summed current. In general, the summed current is converted back to a voltage signal by a transimpedance element to produce the filtered output voltage signal.

In general, the analog filter is configured to perform filtering functions, such as the IIR filtering. In other implementation, the analog filter is configured to perform FIR filtering functions.

These and other implementations can optionally include one or more of the following features. The input can also enter a no-delay transconductance element to be filtered and converted to a no-delay current before summed together with currents produced from different time-delayed input signals. A forward transmission delay line is configured to have at least one forward transmission line delay element for time-delaying the output signal by corresponding at least one forward delay time for using in FIR filtering. A feedback transmission delay line is configured to have at least one feedback transmission line delay element for time-delaying the output signal by corresponding at least one feedback delay time for using in IIR filtering. Each of the forward and feedback transmission delay lines is terminated with a matched or mismatched impedance element according to the filter response requirement. The forward and feedback transmission line delay elements can generate time-delayed input and output signals. The time-delayed input signal and the output signal and the no-delay input signal can be each multiplied by a corresponding transconductance element with a corresponding filter coefficient. The multiplied no-delay input signal, the multiplied time-delayed forward input signal and the multiplied feedback output signal can be converted to corresponding currents by the corresponding transconductance element. The at least one forward current, the at least one feedback current and the no-delay current can be summed into a summed current at the current summing node. A transimpedance amplifier couples to the current summing node to convert the summed node and generate an output voltage signal. The input signal and the output signal can be single ended or differential. In general, the filter coefficient is equal to the transconductance of the transconductance element and is tuned to respond to a system filter requirement specification. These and other implementations can optionally include one or more of the following features. A transconductance element can include a differential transistor pair. A differential gate terminal of the differential transistor pair can couple to the input signal and a differential source terminal of the differential transistor pair can couple to a ground or a negative power supply via a differential current source. A variable resistor can couple between the differential source terminal to tune the transconductance, therefore the filter coefficients of the transconductance element. The variable resistor can be a serial resistor network with a fixed and at least one switched resistor or a parallel resistor network with a fixed and at least one switched parallel resistor. The transimpedance element can be a pair load resistors coupled to the differential drain terminal of the transconductance element. The pair can be replaced by a transimpedance amplifier with feedback impedances to tune the transimpedance amplifier.

In general, the analog filter circuit is implemented according to a filter response requirement in selecting the number of delay elements, delay times of the delay elements, filter coefficients, gain of the amplifiers and layout considerations. An analog filter circuit can implement a variety of FIR filters including low pass filters, high pass filters, band pass filters, notch filters, differentiators, or comb filters. The forward FIR filter coefficients can be easily obtained by taking the Fourier Transform of the system filter response. An alaog filter circuit can implement a variety of IIR filters including low pass filters, high pass filters, band pass filters, notch filters, or integrators. The analog filter described can be implemented in high speed, i.e. 1 GHz to over 100 GHz, for equalization in fiber optic transmission systems, multi-gigahertz serial chip-to-chip communications, multi-gigahertz serial backplane communications, high-speed network communications, disk drive channel equalization, and filtering for radio frequency (RF) systems. The analog filter can be implemented on-chip, off-chip, on printed circuit board or on backplane.

DESCRIPTION OF DRAWINGS

FIG. 5 is a block diagram of an example differential analog IIR filter.

DETAILED DESCRIPTION OF THE INVENTION

Figure 2:
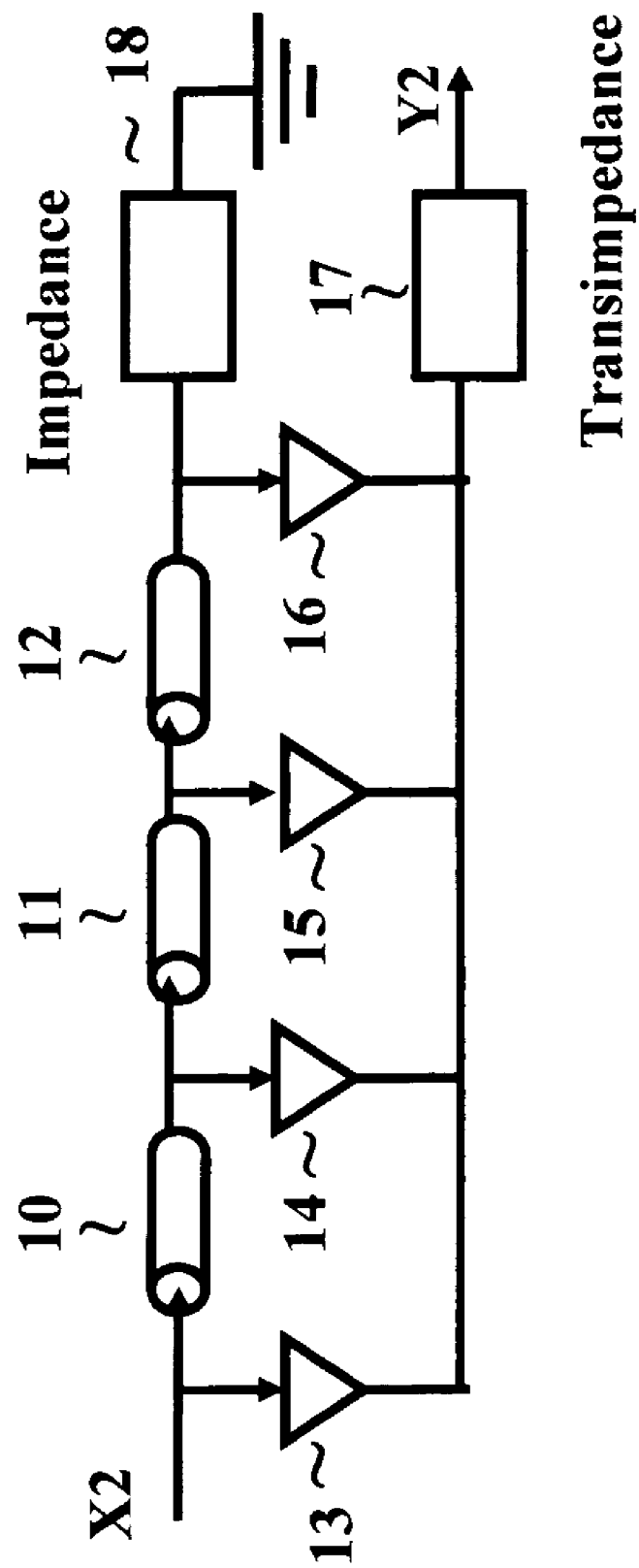
FIG. 2 is a block diagram of an analog FIR filter.

FIG. 2 shows an example block diagram of an N-tap analog FIR filter 200 wherein N is a positive integer. Taking advantage of the above described transmission line properties, a structure comprised of a transmission line delay element and a transconductance element such as the structure 250 can be used as the building block of an analog filter. For example, an N-tap filter can comprise of a plurality of N delay element and transconductance element structure 250, a transimpedance element 222, a termination impedance 221 and a summing node 235 wherein outputs of the N delay and transconductance structure can couple together to form the summing node 235 at an input of the transimpedance element 222. The analog FIR filter 200 can comprise a plurality of N transmission line delay element and transconductance element structure 250, a termination impedance element 221, a transconductance element 210, a transimpedance element 222, an input terminal 230 and an output terminal 240 wherein the transmission line delay element and transconductance element structure 250 further comprises a plurality of N delay elements 201-20N, and a plurality of N analog transconductance elements 210-21N.

The transmission line delay line elements 201-20N can use a coaxial line, a two-wire line, or a plate line including a stripline, and/or a microstrip line or a combination of the above lines. The characteristic impedance $Z_o$ of the transmission line can be a function of the geometric dimensions and the medium of the transmission line such as the intrinsic impedance $\eta$, wherein $\eta = (\mu/\in)^{1/2}$ is a function of the permeability $\mu$ and the permittivity $\in$ of the transmission line medium. For example, the lossless unit characteristic impedance of a coaxial line can be $Z_o = \eta * \ln(ra/rb)/2\pi$ wherein ln is the natural logarithm and ra and rb are the radius of the center and outer conductors of the coaxial line, respectively; and the unit characteristic impedance of a stripline can be $Z_o = (30\pi/\in_r)^{1/2} * d/(W_e + 0.441d)$ wherein $\in_r$ is the stripline permeittivity, d is the height and $W_e$ is an effective width of the center conductor.

An analog input signal signal X(tn) at time to can enter the analog FIR filter 200 at the input terminal 230 to produce a filtered analog output signal Y(tn) at the output terminal The analog FIR filter can perform the FIR filtering function to generate the filtered analog output Y(tn) represented by a general FIR filter equation $$Y(tn) = \sum_{i=0}^{N-1} a(n,1) * X(tn-i),$$

as a function of weighted input and delayed input signals wherein each a(n,i) is a filter coefficient and n is a time index for a time period of Tn. The time period Tn can be an infinitesimal period, for example, on the order of pico seconds for a continuous time analog FIR filter. Y(tn) can be delayed by the propagation time through the analog FIR filter 200. In particular, the input voltage signal, X(tn), enters at the input terminal 230 of the transmission line that can be configured with a plurality of N delay elements 201-20N that can provide a plurality of N corresponding fixed propagation delay time $td_1$-$td_N$. The transmission delay line can be terminated with the termination impedance 221 at the last delay element 21N. In some implementations, the input signal X(tn) can be a discrete analog signal. In other implementations, the input signal X(tn) can be a continuous time analog signal.

The outputs of the transmission line delay elements 201-20N can be coupled to the inputs of the transconductance elements 211-21N, respectively. The analog transconductance elements, 210-21N can have corresponding transconductances $Gm_{n0}$-$Gm_{nN}$ of positive values that can be used as the absolute values of the corresponding filter multiplier coefficients a(n,0) to a(n,N) to perform multiplication functions, i.e. FIR filtering, of the analog FIR filter 200. In particular, abs(a(n,i))=$Gm_{ni}$ for i=0, 1 to N can be tuned for different time periods. In addition, each of the transconductance elements 210-21N can convert a multiplied input voltage signal to a current. The input signal X(tn) can also be coupled to an input of the transconductance element 210. The outputs of the transconductance elements 210-21N can be coupled together to form the summing node 235 at an input of the transimpedance element 222 to sum a plurality of N+1 multiplied output currents into a summed current. The transimpedance element 222 can be configured to convert the summed current to an output voltage signal Y(tn). In some implementations, the transconductance elements 210-21Nn can be configured as transconductance amplifiers or multistage voltage amplifiers. In some implementations, matching impedances can be coupled to inputs and/or outputs of the transconductance elements 210-21N. In some implementations, the transimpedance element 222 can be configured to be transconductance amplifiers, multistage voltage amplifiers, resistors, impedances, or a combination of resistors, impedances and voltage amplifiers. In some implementations, the transimpedance element 222 implemented as a transimpedance amplifier can amplify the summed current with a gain in addition to convert the current input to a voltage output Y(tn). Further the transimpedance element 222 configured as the transimpedance amplifier of an operation amplifier and an impedance feedback loop can reduce signal noise. In some implementations, the transimpedance element 222 can use a load resistor to convert a current input to a FIR filtered output voltage signal Y(tn). The transmission line can be terminated at the end with impedance element, 221. In some implementations, the FIR filtered output voltage signal Y(tn) can be an equalized signal.

Figure 1:
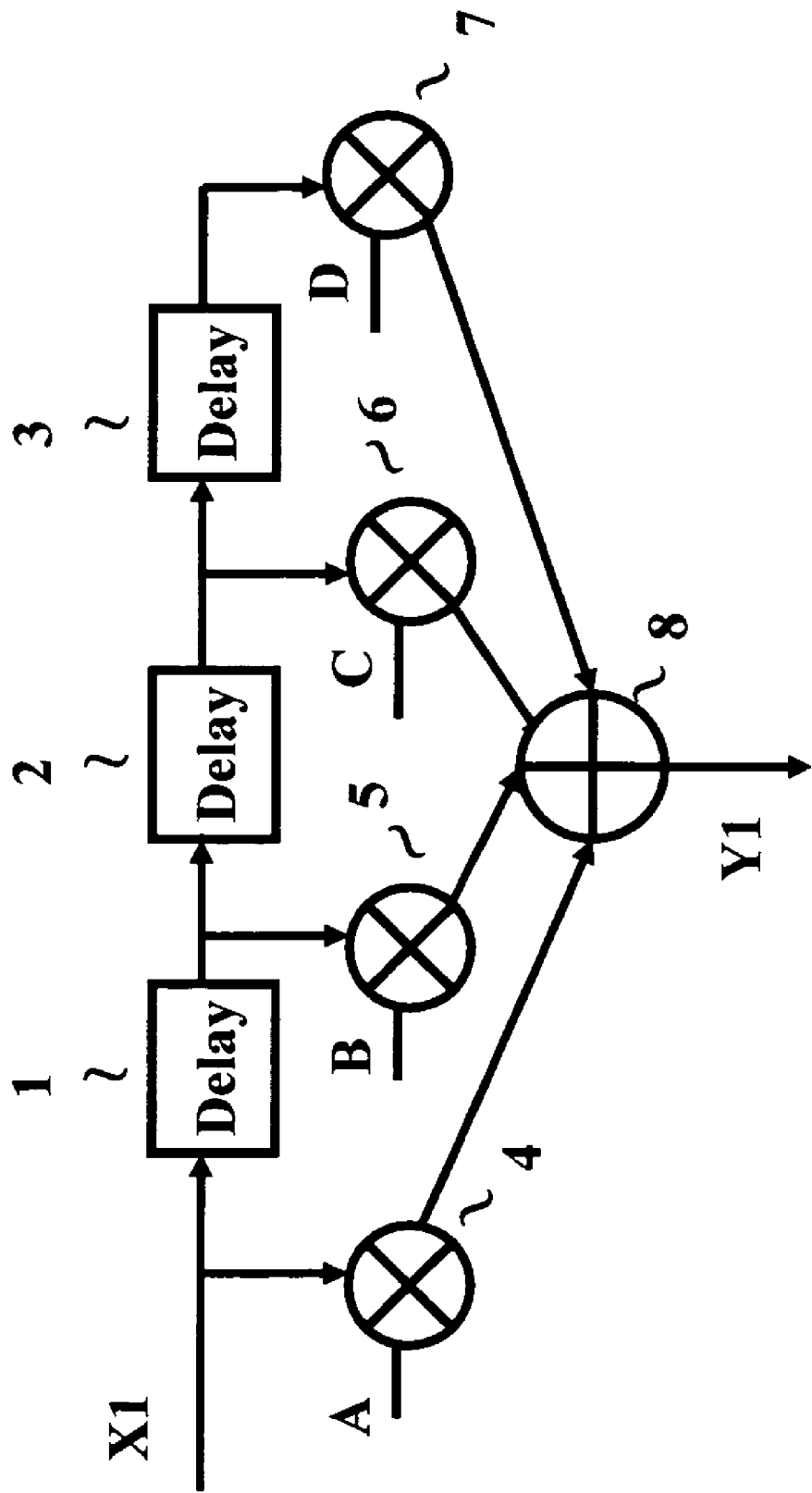
FIG. 1 is a block diagram of a FIR filter considered as prior art.

The transmission line with delay elements 201-21N can provide linearity for signals of frequencies from around 1 GHz to above 100 GHz. Therefore, the analog FIR filter 200 can extend the bandwidth and improves the linearity performance when compared to the prior art FIR filter shown in FIG. 1. The filter coefficients a(n,0)-a(n,N) for the time period to can be controlled by modifying the transconductances, $Gm_{n0}$-$Gm_{nN}$, of the analog transconductance amplifiers. The values of the transconductances $Gm_{n0}$-$Gm_{nN}$ can be fixed, programmable, or adaptively controlled. In some implementations, the transmission line delay elements can have switches to change the number of the transmission delay elements. In some implementations, the termination impedance, 221, can be matched to the transmission line characteristic impedance in order to eliminate reflections. In other implementations, the termination impedance 221, can be purposely mismatched to induce a reflection to alter the response of the filter. In some implementations, the termination impedance 221 and/or the matching impedances to the inputs and/or outputs of the transconductance elements 210-21N can further comprise resistors, capacitors, inductors or a combination of resistor, capacitor and/or inductor networks. In some implementations, the termination impedance 221 and/or the matching impedances to the inputs and/or the outputs of the transconductance elements 210-21N can be configured to be fixed, programmable or adaptive impedances.

The analog FIR filter 200 can be single ended or differential. Since the transconductance coefficients Gm's can have positive values only, a full differential or a pseudo-differential analog filter can be employed for a general filter requirement with both positive and negative filter coefficients. For a full differential analog FIR filter 200 with differential input X(tn), the transconductance elements 210-21N and the transimpedance elements 201-20N are differential and two transmission delay lines are used. However, a pseudo-differential analog FIR filter can have only a single transmission line for a single ended input signal X(tn) and the differential transimpedance elements 201-20N can convert single ended signals into differential signals. In addition, a differential or pseudo-differential analog FIR filter can have better noise immunity compared to a single ended analog FIR filter 200.

The topology of the analog FIR filter 200 can be selected according to a system filter requirement specification. The analog FIR filter 200 can be applied in high speed backplanes, disk drives, optical systems, video systems, and wireline and wireless communication systems. In some implementations, the analog FIR filter 200 can be used after the number of filter taps, the delay time of each delay element, and the filter coefficients are determined according to a FIR filter system requirement. In some implementations, the transmission line of delay elements and the transconductance elements can be transposed to perform the same FIR filtering function. However, additional transimpedance elements may be needed in order to convert currents back to voltages before entering the transmission line delay lines in a transposed structure of the analog FIR filter 200. In other implementations, the order, the number of the transmission line delay elements and the transconductance elements can be designed differently from the analog FIR filter 200 or its transposed form but can still perform the same FIR filter functions.

Figure 3:
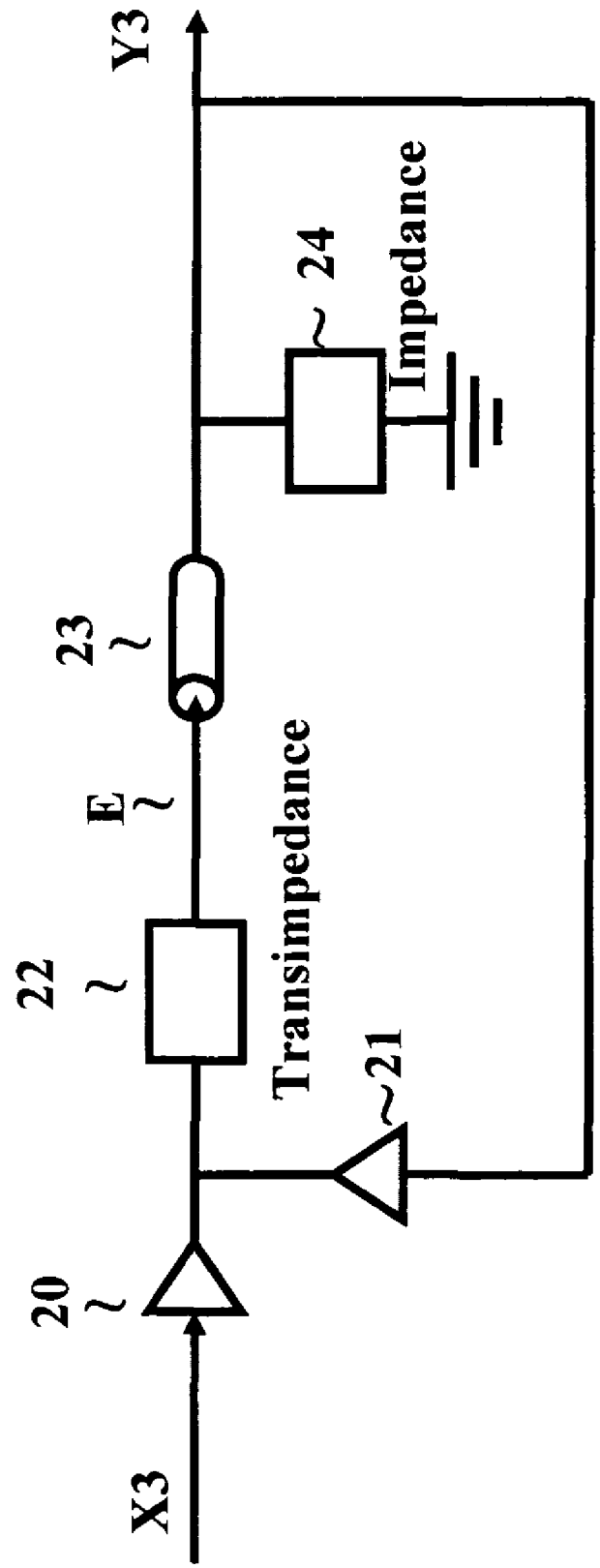
FIG. 3 is a block diagram of an example analog IIR filter.

FIG. 3 is an example block diagram of an analog N+N' tap infinite impulse response (IIR) filter 300, wherein N and N' can be different positive integers or N can be equal to N'. The same building blocks, i.e. the delay element and transconductance element structure 250, used in the analog FIR filter 200 of FIG. 2 can be used to create the analog IIR filter 300 for both a forward propagation filtering section 335 and a feedback propagation, i.e. a feedback loop, filtering section 345. The IIR filter 300 uses a feedback loop in its filter structure and can perform filter functions that are represented by a general IIR filter equation with an input signal X(tn) and an output signal Y(tn), $$Y(tn) = \sum_{i=0}^{N} a(n, i) * X(tn - i) + \sum_{j=1}^{N'} b(n, j) * Y(tn - j),$$

wherein X(tn) is an analog input signal, Y(tn) is an analog filter output signal, X(tn−i)'s and Y(tn−j)'s are delayed input and output signals, a(n,i)'s and b(n,j)'s are filter coefficients, and n can denote a time index for a time period of Tn. Therefore, a FIR filter such as the analog FIR filter 200 in FIG. 2 can be a special case of the IIR filter 300 when all the filter coefficients b(n,j)=0 for all the j's. The analog IIR filter 300 can comprise a feedback propagation transmission line of a plurality of N' delay elements 351-35N' that can provide a plurality of corresponding delay times $td'_1$–$td'_{N'}$, a forward transmission line of a plurality of delay elements 301-30N that can provide a plurality of corresponding delay times $td_1$–$td_N$, a plurality of N+1 transconductance elements 310-31N of a plurality of N+1 corresponding transconductances $Gm_{n0}$-$Gm_{nN}$ and a plurality of N' transconductor elements 361-36N' of a plurality of N' corresponding transconductances $Gm'_{n1}$-$Gm'_{nN'}$, a forward transmission line termination impedance 321, a feedback transmission line impedance 322, a transimpedance element 323, an input terminal 330 and an output terminal 340, wherein the transconductance $Gm_{n0}$-$Gm_{nN}$ and $Gm'_{n1}$-$Gm'_{nN'}$ are positive values and can be used as the absolute values of corresdponding filter coefficients a(n,0)a(n,N) and b(n,1)–b(n,N).

The filter operation of the analog IIR filter 300 can be described similarly to that for the FIR filter 200 shown in FIG. 2. In particular, the input voltage signal X(tn) can enter the IIR filter 300 and the transconductance element 310 at the input terminal 330, then propagate through the forward transmission line delay elements 311-31N, and the filtered output voltage signal Y(tn) can be feedback through the feedback transmission line delay elements 351-35N'. The input signal X(tn) and the outputs of the forward and feedback transmission line delay elements 311-31N and 351-35N' can be coupled to corresponding inputs of the transconductance elements 310-31N and 361-36N' before being multiplied by the corresponding filter coefficients, i.e., the transconductances $Gm_{n0}$-$Gm_{nN}$ and $G_nm'_1$–$Gm'_{nN'}$ to perform the IIR filtering and being converted to currents at the outputs of the transconductance elements 310-31N and 361-36N'. The outputs of the transconductance elements 310-31N and 361-36N' are coupled together and to the input of the tramsimpedance 323 to sum the output currents at the input of the transimpedance 323 which then converts the resulting summed current at its input into the output voltage signal Y(tn) at the filter output terminal 340. In some implementations, the IIR filtered output voltage signal Y(tn) can be an equalized signal.

Similar to the FIR filter 200 in FIG. 2, the transconductance elements 310-31N and 361-36N' can be implemented as transconductance amplifiers or multistage voltage amplifiers, and the multiplication filter coefficients can be controlled by modifying the corresponding transconductances, $Gm_{n0}$-$Gm_{nN}$ and $Gm'_{n1}$-$Gm'_{nN'}$ of the analog transconductance amplifiers 310-31N and 361-36N'. In some implementations, matching impedances can be coupled to inputs of the transconductance elements 210-21N. Similarly, the transimpedance element 323 can be implemented with a load resistor, a transimpedance amplifier, multistage voltage amplifiers, resistors, impedances, or a combination of resistors, impedances and voltage amplifiers. In some implementations, the transimpedance element 323 implemented as a transimpedance amplifier and can amplify the input current signal with a gain in addition to convert a current input to a voltage output. Further the transimpedance element 323 configured as the transimpedance amplifier with an impedance feedback loop can reduce signal noise. In some implementations, the transimpedance element 323 can use a load resistor to convert a current input to a voltage output. In some implementations, the transimpedance element 323 can be configured to be fixed, programmable or adaptive.

The values of the transconductances Gm and Gm' can be fixed, programmable, or adaptively controlled. As in the FIR filter 200, the forward and feedback transmission lines can be terminated with the termination impedance elements, 321 and 322. The termination impedance, 321 and 322, can be matched to characteristic impedances of the transmission line, respectively in order to eliminate reflections, or can be purposely mismatched to induce a reflection to alter the response of the filter. In some implementations, the termination impedances 321 and 322 and/or the matching impedances to the inputs and/or of the transconductance elements 310-31N and 361-36N' can further comprise resistors, capacitors, inductors or a combination of resistor, capacitor and/or inductor networks. In some implementations, the termination impedance 321 and 322 and/or the matching impedances to the inputs and/or outputs of the transconductance elements 310-31N and 361-36N' can be configured to be fixed, programmable or adaptive impedances.

Similar to the analog FIR filter 200 shown FIG. 2, the analog IIR filter 300 can be single ended, pseudo-differential or differential. A single ended analog IIR filter 300 can have only positive or negative filter coefficients and a differential or pseudo-differential analog filter 300 can be employed for a general filter with both positive and negative filter coefficients.

In some implementations, the analog IIR filter 300 can be used after the number of filter taps, the delay time of each delay element, and the filter coefficients are determined according to an IIR filter system requirement. In some implementations, the transmission line of delay elements and the transconductance elements can be transposed to perform the same IIR filtering function. However, additional transimpedance elements may be needed in order to convert currents back to voltages before entering the transmission line delay lines in a transposed structure of the analog IIR filter 300. In other implementations, the order, the number of the transmission line delay elements and the transconductance elements can be designed differently from the analog IIR filter 300 or its transposed form but can still perform the same IIR filter functions. In addition, a pseudo-differential or differential analog IIR filter 300 can have better noise immunity compared to a single ended analog IIR filter. The topology of the analog IIR filter 300 can be selected according to a system filter requirement.

When all the filter coefficients $Gm'_1$–$Gm'_{N'}$ are zero, the feedback loop section 345 can be removed in the circuit and the analog IIR filter 300 is reduced to the analog FIR filter 200 shown in FIG. 2. Therefore, the analog FIR filter 200 can be considered as a special case of the analog IIR filter 300.

Figure 4A:
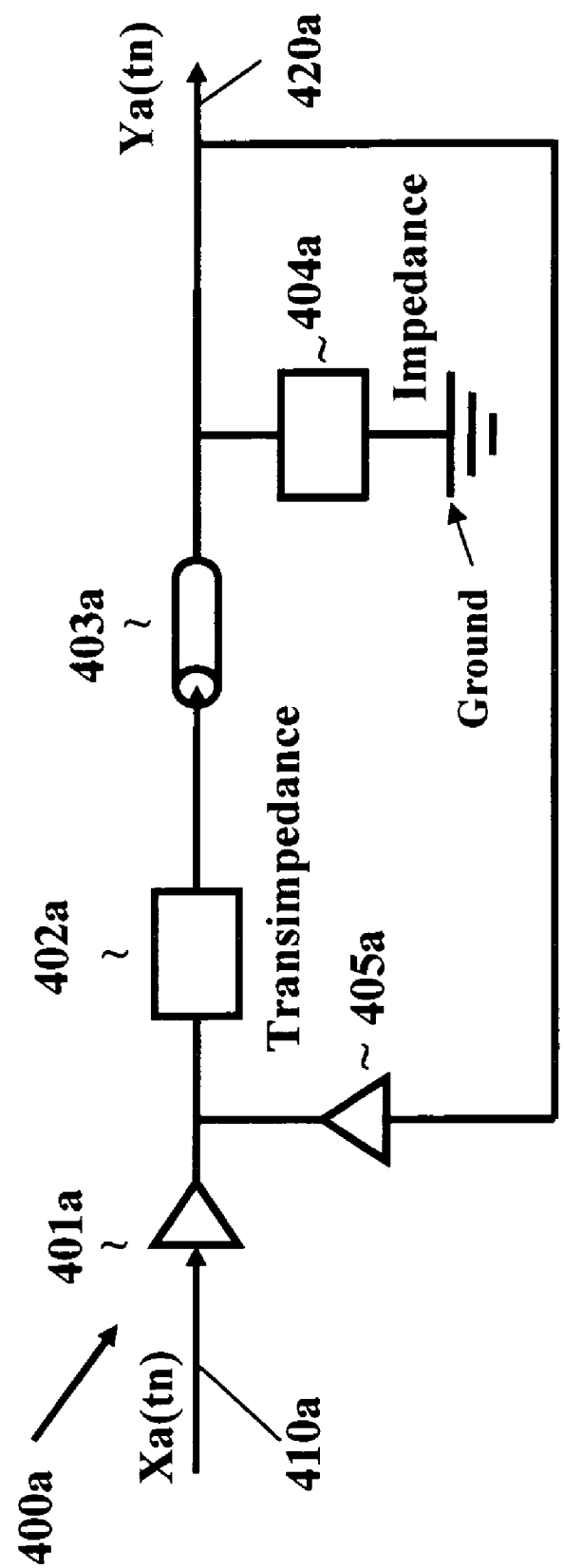
FIG. 4a is a block diagram of an example 1-tap analog IIR filter.
Figure 4B:
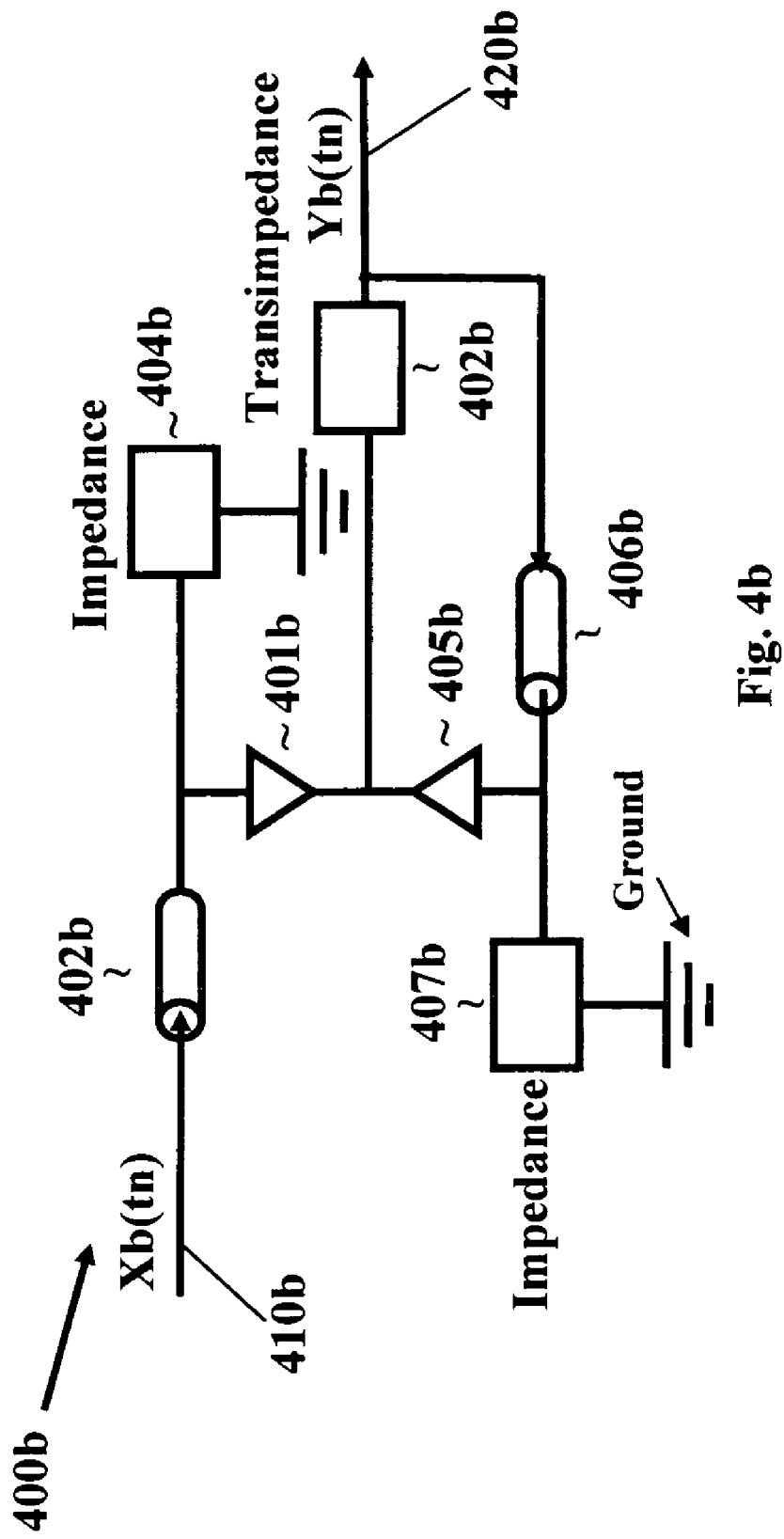
FIG. 4b is a block diagram of an example analog IIR filter.

FIGS. 4a and 4b are schematics of an example 1-tap analog IIR filters 400a and 400b configured to perform IIR filtering functions according to the filter equation (2) Y(tn)=a(n,1)*X(tn−1)+b(n,1)*Y(tn−1), wherein Y(tn) can be an output signal at a time −tn, X(tn−1) and Y(tn−1) can be delayed input and output signals, and a(n, 1) and b(n,1) can be filter coefficients. The IIR filter 400a comprises a single transmission line delay element 403, two transinductance elements 401a and 405a, a transimpedance 402a and a termination impedance 404a, an input terminal 410a and an output terminal 420a. The transconductance elements 401a can multiply an input voltage signal Xa(tn) at the input terminal 410a by a first filter coefficient $Gm_1$, i.e. the transconductance of the transconductance element 401a, and convert the weighted input signal to a current. The output voltage signal Ya(tn) can be multiplied by a second filter coefficient $Gm'_1$, i.e. the transconductance of the transconductance element 405a and converted to a current. The IIR filtering function can be performed by the transconductance elements 401a and 405a. The transimpedance element 402a can convert the resulting summed current of the output currents from the transcnductance elements 401a and 405a with a delay time of td. The filtered output signal at the output of the transimpedance element 402a can enter the transmission line delay element 403a which can be terminated by the termination impedance 404a. The output signal Y(tn) at the output terminal 420a of the transmission line delay element 403a can be the output signal Y(tn) of the analog IIR filter 400a.

FIG. 4b is another example schematic of an analog IIR filter 400b which can also perform the same IIR filter equation (2) Y(tn)=a(n,1)*X(tn−1)+b(n,1)*Y(tn−1). The analog IIR filter 400b can be constructed by using the structure of the analog filter 300 shown in FIG. 3 for a 2-tap analog IIR filter, i.e. 1-tap for the forward transmission line delay element 402a and 1-tap for the feedback transmission line delay element 406b wherein the two transmission line delay elements are identical. The forward and feedback transmission line delay elements 402b and 406b can be terminated by the termination impedance elements 404b and 407b, respectively. An input signal X(tn) can propagate through the forward transmission line delay element 402b and be delayed by the delay 370 time td. The transconductance element 401b then multiply the delayed output signal of the delay element 402b by a first filter coefficient $Gm_1$, i.e. the transconductance of the transconductance element 401b and convert the filtered signal to a first current signal. The output signal Y(tn) of the analog IIR filter 400b can propagate through the feedback transmission line delay element 406b with the delay time td. The transconductance element 405b can multiply the delayed output signal from the feedback transmission line delay element 406b with a second filter coefficient $Gm'_1$, i.e. the transconductance of the transconductance element 405b and convert the filtered output signal to a second current signal to be combined with the first current signal at an input of the transimpedance element 402b before converted back to the output voltage signal Y(tn). In some implementations, the IIR filtered output voltage signal Y(tn) can be an equalized signal.

Both the analog IIR filters 400a and 400b perform the same IIR filtering but the IIR filter 400b requires one more transmission line delay element and one more termination element compared with that of the analog IIR filter 400a. In other implementations, a transposed structure of the analog filter 400b can be used.

If the feedback loops of the analog IIR filters 400a and 400b are eliminated, the analog filters 400a and 400b can be FIR filters and filter 400b can represent a transposed filter 400a. Similarly, analog FIR filters such as FIR filter 200 can be implemented in different filter structures.

Similarly, the analog IIR filters 400a and 400b can be single ended, pseudo-differential or differential. A single ended analog IIR filter 400a or 400b can perform a filter function of only positive or negative filter coefficients. A pseudo-differential or differential analog IIR filter 400a or 400b can perform a filter function with both positive and negative filter coefficients. Similarly, the transconductance elements 401a, 405a, 401b and/or 405b can be fixed, programmable and adaptive. In some implementations, matching impedances can be coupled to inputs and/or outputs of the transconductance elements 401a, 405a, 401b and/or 405b. In some implementations, the transimpedance element 402a, and/or the termination impedance 404a can be configured to be fixed, programmable or adaptive. In some implementations, the matching impedances coupled to the inputs and/or the outputs of the transconductance elements 401a, 405a, 401b and/or 405b can be configured to be fixed, programmable or adaptive impedances.

For a general IIR or FIR filter, differential transconductance and transimpedance elements can be used to perform filtering with both positive and negative filter coefficients. FIG. 5 is a schematic of an example differential analog IIR filter 500. The differential analog IIR 500 can be a 5-tap IIR filter with 3 taps from the forward transmission line configured by forward delay element pairs 501-503, and 2 taps from the feedback transmission line comprising forward delay element pairs 501-505, wherein each pair of the delay elements 501-505 comprises two identical delay elements for a differential signal. The analog IIR filter 500 is similar to the analog filter 300 shown in FIG. 3 except that the input signal X(tn), the output signal Y(tn), transconductance elements 510-515 and the transimpedance element 523 are differential to perform filtering according to the filter equation (3) from a system requirement specification $$Y(tn) = \sum_{i=0}^{3} a(n,i) * X(tn-i) + \sum_{j=1}^{2} b(n,j) * Y(tn-j).$$

The use of differential elements can allow the implementation of filter equations with both positive and negative filter coefficients as well as for better noise immunity. By coupling differential outputs from the delay elements 510, 511, 513 and 515 and cross coupling, or swapping, differential outputs from the delay elements 502 and 504, to differential inputs of transconductance amplifiers 512 and 514, i.e. a positive output of a delay element couples to a negative input of a transconductance amplifier and a positive output of a delay element couples to a negative input of a transconductance amplifier, the analog IIR filter 500 can perform the above filter function with positive multiplication coefficients a(n,0), a(n,1), a(n,3) and b(n,2), and negative multiplication coefficients a(n,2) and b(n,1). In some implementations, the feedback filter coefficients b(n, 1) and b(n,2) can be zero to provide an analog FIR filtering function. Therefore, the differential analog IIR filter 500 can be a differential analog FIR filter by removing a feedback loop 525, i.e. the feed forward section 520 can be a differential analog FIR filter, i.e. an analog FIR filter is a special case of an analog IIR filter.

In some implementations, each of the transconductance elements 510-515 can be configured to be fixed, programmable or adaptive. In some implementations, the transimpedance element 523 and/or the termination impedance 521 and 522 can be configured to be fixed, programmable or adaptive. In some implementations, matching impedances can be coupled to inputs and/or outputs of the transconductance elements 510-515. In some implementations, matching impedances coupled to the inputs and/or outputs of the transconductance elements 510-515 can be configured to be resistors, capacitors, inductors and/or combination networks of at least one type of the resistors, capacitors, and inductors and to be fixed, programmable or adaptive impedances. In some implementations, the input signal X(tn) can be single ended but can be converted to a differential signal by the differential transconductance elements 510-515 and the differential transimpedance element 523 for a general filter implementation. In this case, each of the transmission line delay elements 501-505 can include only a single delay element.

Figure 6A:
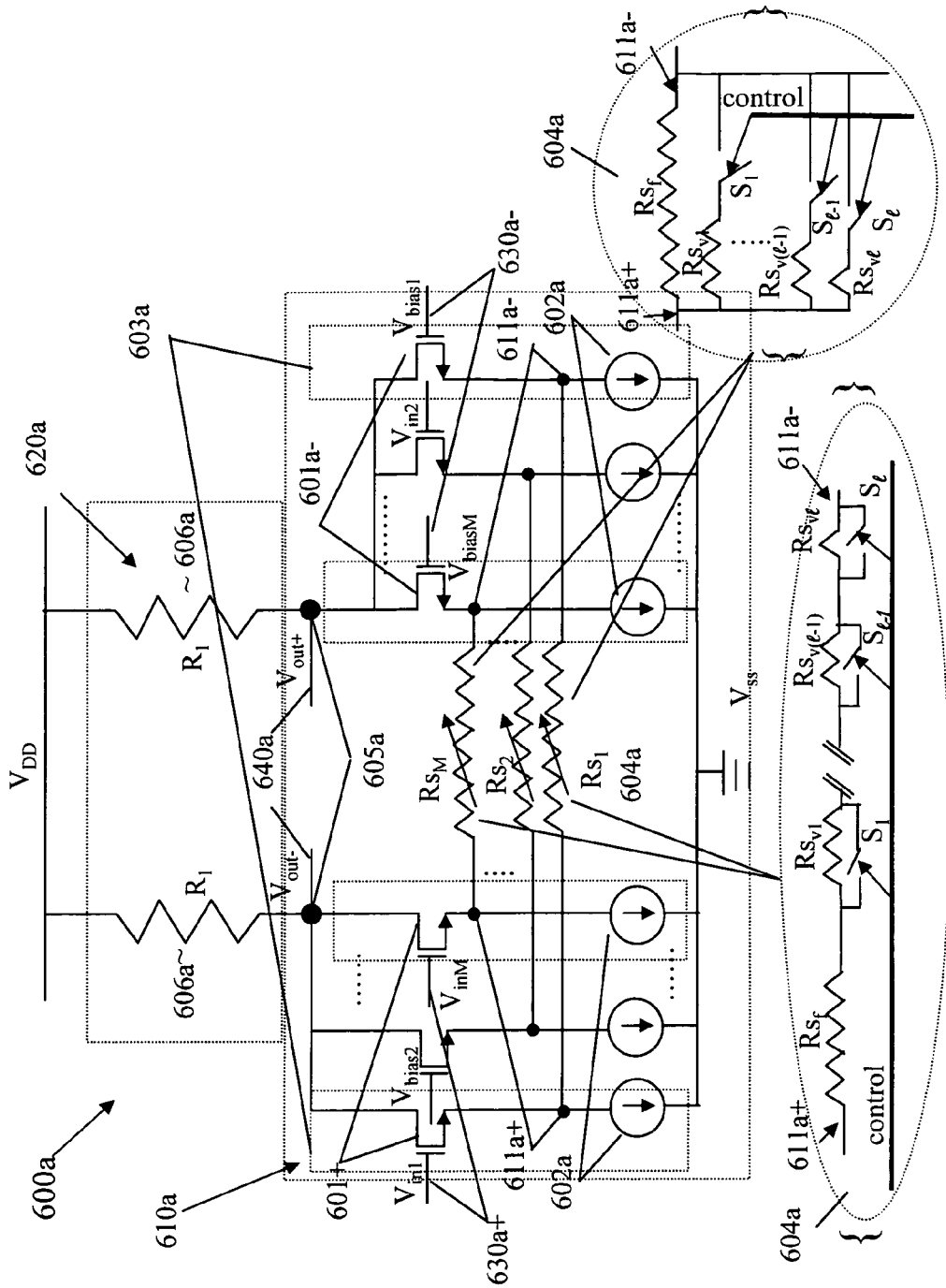
FIG. 6a is a schematic of an example transconductance and transimpedance circuit.
Figure 6B:
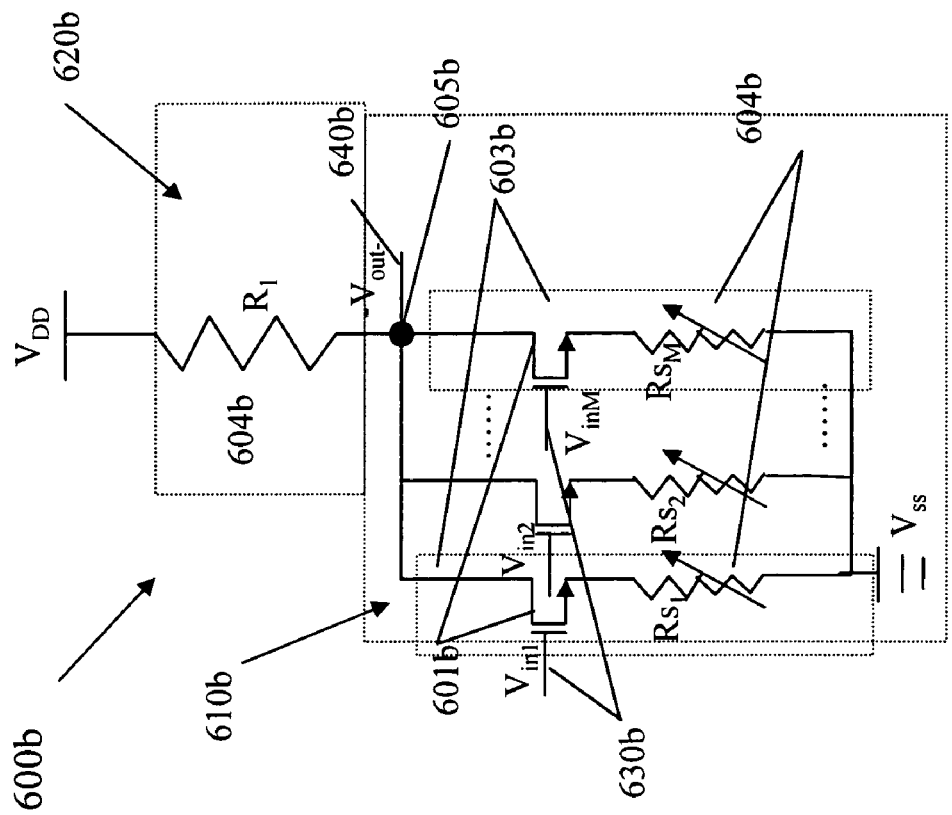
FIG. 6b is a schematic of an example single ended transconductance and transimpedance circuit.

FIGS. 6a and 6b show example schematics of transconductance and transimpedance circuits 600a and 600b. FIG. 6a shows a transconductance and transimpedance circuit 600a for single ended input voltage signals $V_{in1}$–$V_{inm}$. The transconductance and transimpedance circuit 600a can be used for the analog FIR or IIR filters as described above. The transconductance and transimpedance circuit 600a comprises a differential input terminal 630a, a differential output terminal 640a, a transconductance circuit 610a configured to include a plurality of M differential transconductance circuit segments 603a and a transimpedance circuit 620a, wherein M is an integer and the M differential circuit segments 603a can have corresponding transconductance $Gm_1$-$Gm_M$. Each of the transconductance Gm of a transconductance circuit segment 603a can be used as an absolute value of a filter coefficient and equal to 1/[(gm*Rs/2+1)*2] wherein Rs is a variable resistor and gm is the transconductance of the transistor 601a and equal to $k_p$*(Wc/Lc)*(Vgs−Vt) with $k_p$ a fabrication process dependent constant, Wc and Lc channel dimensions, Vgs a gate to source voltage and Vt a threshold voltage of the transistor 601. Specifically, an absolute value of each filter coefficient, i.e. abs(c(k))=$Gm_k$, can be used to multiply the single ended input voltage signal $V_{ink}$ wherein k=0 to N and each $V_{ink}$ can be an output signal from a transmission line delay element, for example, delay element 20k shown in FIG., delay element 30k or 35k shown in FIG. 3. $V_{bias1}$-$V_{biasM}$ are corresponding differential bias voltages input to the differential transconductance circuit 610a.

The differential transconductance circuit 610a further comprises a plurality of M differential transistors 601a, a plurality of M differential current sources 602a, and a plurality of M variable resistors 604a of resistances $Rs_1$-$Rs_M$, coupled between a plurality of M corresponding source terminals 611a+ and 611a− of the M differential transistors, that can be used to tune the transconductances Gm's of the transconductance circuit segments 603a. Herein a plurality of M differential gate terminals 630a of corresponding M differential transistors 601a can couple to a plurality of M corresponding input signals $V_{in0}$-$V_{inm}$ and a plurality of corresponding M bias voltages $V_{bias1}$—$V_{biasM}$ according to a sign of a corresponding filter coefficient of the general FIR or IIR filter equation. Specifically, an input signal $V_{in}$ can be coupled to a positive input terminal 630a+ and a corresponding bias voltage $V_{bias}$ to a negative input terminal 630a− for the input signal $V_{in}$ to be multiplied by a positive filter coefficient, and the input signal $V_{in}$ can cross couple to the negative terminal 630a− and the bias voltage $V_{bias}$ to the positive terminal 630a+ for the input signal $V_{in}$ to be multiplied by a negative filter coefficient. A plurality of M differential source terminals of the corresponding M diffrenential transistors 601a further couple to a negative power supply or a ground via a corresponding plurality of M differential current sources 602a. The input signals $V_{in1}$-$V_{inm}$ and the bias voltages $V_{bias1}$-$V_{biasM}$ at the differential input terminals 630a can be multiplied by corresponding filter coefficients $Gm_1$-$Gm_M$, and converted to currents at the drain terminals of the transistors 601a which are connected together at nodes 607a as a summer to sum the output filtered currents.

The transimpedance circuit 620a comprises load resistors 606a of resistance R1, coupled between the node 605a and the power supply Vdd, can convert the resulting summed differential current to a differential output voltage $V_{out+}$ and $V_{out−}$, at a differential output terminal 640a, wherein the positive output voltage $V_{out+}$ can be at the drain of the transistors 601a− and the negative output voltage $V_{out−}$ can be at the drain of the transistors 601a+. In other implementations, one of the differential output Vout+ and Vout− at the differential output terminal 640 can be used for a single ended output if a single ended output is desired.

In some implementations, the transconductance and transimpedance circuit 600a can be fully single ended for analog IIR or FIR filters whose filter functions can require only all positive or all negative filter coefficients. However, a full single ended FIR or FIR analog filter can have noise compared to a pseudo-differential or a full differential analog filter. The toplogy of the transconductance and transimpedance circuit 600a can be selected according to a system filter requirement specification.

The variable resistor networks 604a can tune the absolute values of filter coefficients, i.e. the transconductances, $Gm_1$-$Gm_M$ of the transconductance circuit 610a according to a system filter requirement. Each of the variable resistor $Rs_1$-$Rs_M$ can be a resistor network configured as, for example, a serial resistor network 611a or a parallel resistor network 612 with a fixed resistor of resistance $Rs_f$ and a plurality of 1 switchable resistors of resistances $Rs_{v1}$-$Rs_{vl}$ controlled by switches $S_1$ to $S_l$ wherein l can be a positive integer. In some implementations, the resistor network 604a can be employed to increase a net resistance from the fixed resistor value $Rs_f$ by switching in resistances $Rs_{v1}$-$Rs_{vl}$. In other implementations, the resistor network 604a can decrease its net resistance Rs from the fixed resistor value $Rs_f$ by switching in parallel resistors $Rs_{v1}$-$Rs_{vl}$. For example, each $Rs_v$ can be $Rs_f/2^i$ for i=1−l and the total resistance Rs of the serial resistor network 604a can be between $Rs_f$ and $Rs_f*2*(1-1/2^{l-1})$. Similarly, the total resistance of the parallel resistor network 604a can be between $Rs_f$ and $Rs_f/(2^{l-1}-1)$. The examples are exemplary and some implementations can use resistor and inductor, resistor and capacitors or a combination of resistor, inductor and capacitor networks to tune the transconductances $Gm_1$-$Gm_M$ for a FIR or IIR filter response requirement. Therefore, the transconductance circuit 610 can be fixed, programmable or adaptive. In some implementations, additional switches can be employed to vary the load resistors 606a of the transimpedance circuit 620a for a programmable or an adaptive transimpedance circuit. In some implementations, matching impedances can be coupled to inputs and/or outptus of the transconductance circuit segments 603a. In some implementations, matching impedances coupled to the inputs and/or the outputs of the transconductance circuit segments 603a can be fixed, programmable or adaptive impedances and can comprise resistors, capacitors, inductors and/or combination networks of resistors, capacitors, inductors and/or combination networks of at least two types of resistors, capacitors, and inductors.

FIG. 6b show a schematic of an example single ended transconductance and transimpedance circuit 600b. The transconductance and transimpedance circuit 600b is similar to a branch of the differential transconductance and transimpedance circuit 600a except that the variable resistors $Rs_1$-$Rs_M$ are coupled between corresponding source terminals of transistors 610b and a negative power supply or a ground. The filter operation of the transconductance and transimpedance circuit 600b is similar to that of the transconductance and transimpedance circuit 600a except the values of the transconductances $Gm_1$-$Gm_N$ of the transconductance transconductance circuit segments 603b. Each of the transconductances $Gm_1$-$Gm_N$ of a transconductance circuit element can be Gm=1/(gm*Rs/2+1) wherein gm is the transistor transconductance and Rs is a variable resistor network as described above. However, an output voltage signal −$V_{out}$ at an output terminal 640b of the transconductance and transimpedance circuit 600b can be 180 degree out of phase to an input signal $V_{in}$ at an input terminal 630b. Since the transconductances $Gm_1$-$Gm_N$ can be only be positive, and a 180° phase shifter or an inverter can be needed to obtain the output signal $V_{out}$ for a filter of positive filter coefficients. For an analog IIR filter of negative filter coefficients, the output signal −$V_{out}$ at the output terminal 640b can be used.

Similarly, the transconductance circuit 610b can be fixed, programmable or adaptive. In some implementations, additional switches can be employed to vary the load resistors 606b of the transimpedance circuit 620b for a programmable or adaptive transimpedance circuit. In some implementations, matching impedances can be coupled to inputs and/or outputs of the transconductance circuit segments 603b. In some implementations, matching impedances coupled to the inputs and the outputs of the transconductance circuit segments can be configured to comprise resistors, capacitors, inductors and/or combination networks of resistors, capacitors, inductors and/or combination networks of at least two types of resistors, capacitors, and inductors; and configured to be fixed, programmable or adaptive impedances.

Figure 7:
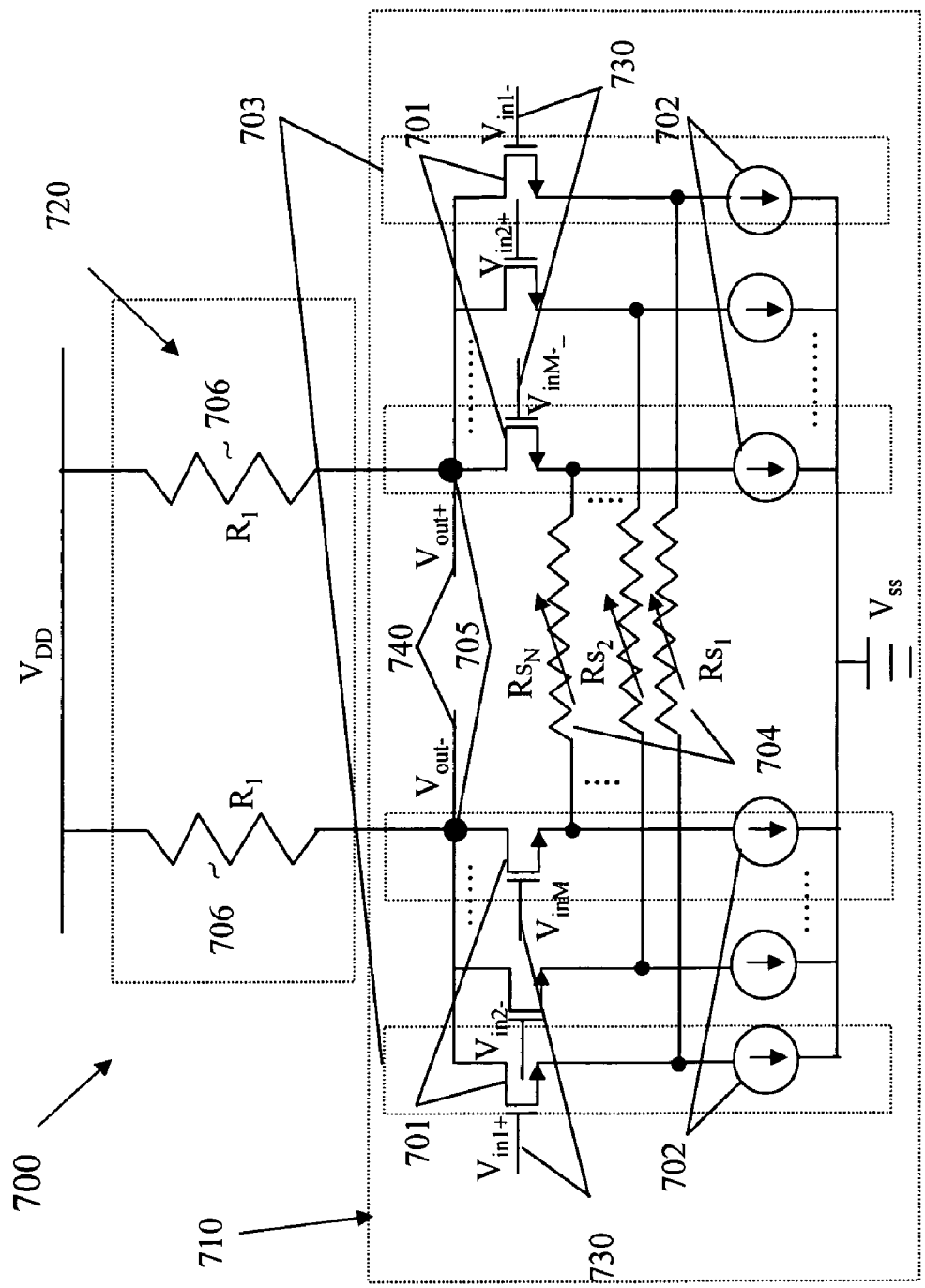
FIG. 7 is a schematic of an example transconductance and transimpedance circuit.

FIG. 7 shows an example schematic of a full differential transconductance and transimpedance circuit 700 for a differential input signal $V_{in}$. The transconductance and transimpedance circuit 700 is similar to the transcondcutance and transimpedance circuit 600 shown in FIG. 6 except that the input signals $V_{in1}$-$V_{inm}$ are differential signals coupled to differential input terminals 630 of the differential transcondcutance and transimpedance circuit 700 and the differential output signal $V_{out}$ can be coupled to the differential output terminal 740 of the transconductance and transimpedance circuit 700. Similarly to the description of FIG. 6, a differential input signal $V_{in}+$ and $V_{in}-$ can be coupled to the positive input terminal 730+ and negative input terminal 730−, respectively to be multiplied by a positive filter coefficient. Further, the differential input signal $V_{in}+$ and $V_{in}-$ can be coupled to the negative input terminal 730− and positive input terminal 730+, respectively to be multiplied by a negative filter coefficient. A filter coefficient used to multiply a differential input signal in a full differential transconductance circuit segment 703 can be 1/(gm*Rs/2+1) wherein gm is the transconductance of the transistor 701. Similarly, the transconductance circuit 710 can be fixed, programmable or adaptive. In some implementations, additional switches can be employed to vary the load resistors 706 of the transimpedance circuit 720 for a programmable or an adaptive transimpedance circuit. In some implementations, matching impedances can be coupled to inputs and or outputs of the transconductance circuit segments 603. In some implementations, matching impedances coupled to the inputs and/or the outputs of the transconductance circuit segments 603 can comprise resistors, capacitors, inductors and/or combination networks of resistors, capacitors, inductors and/or combination networks of at least two types of resistors, capacitors, and inductors; and be configured to be fixed, programmable or adaptive impedances.

Figure 8:
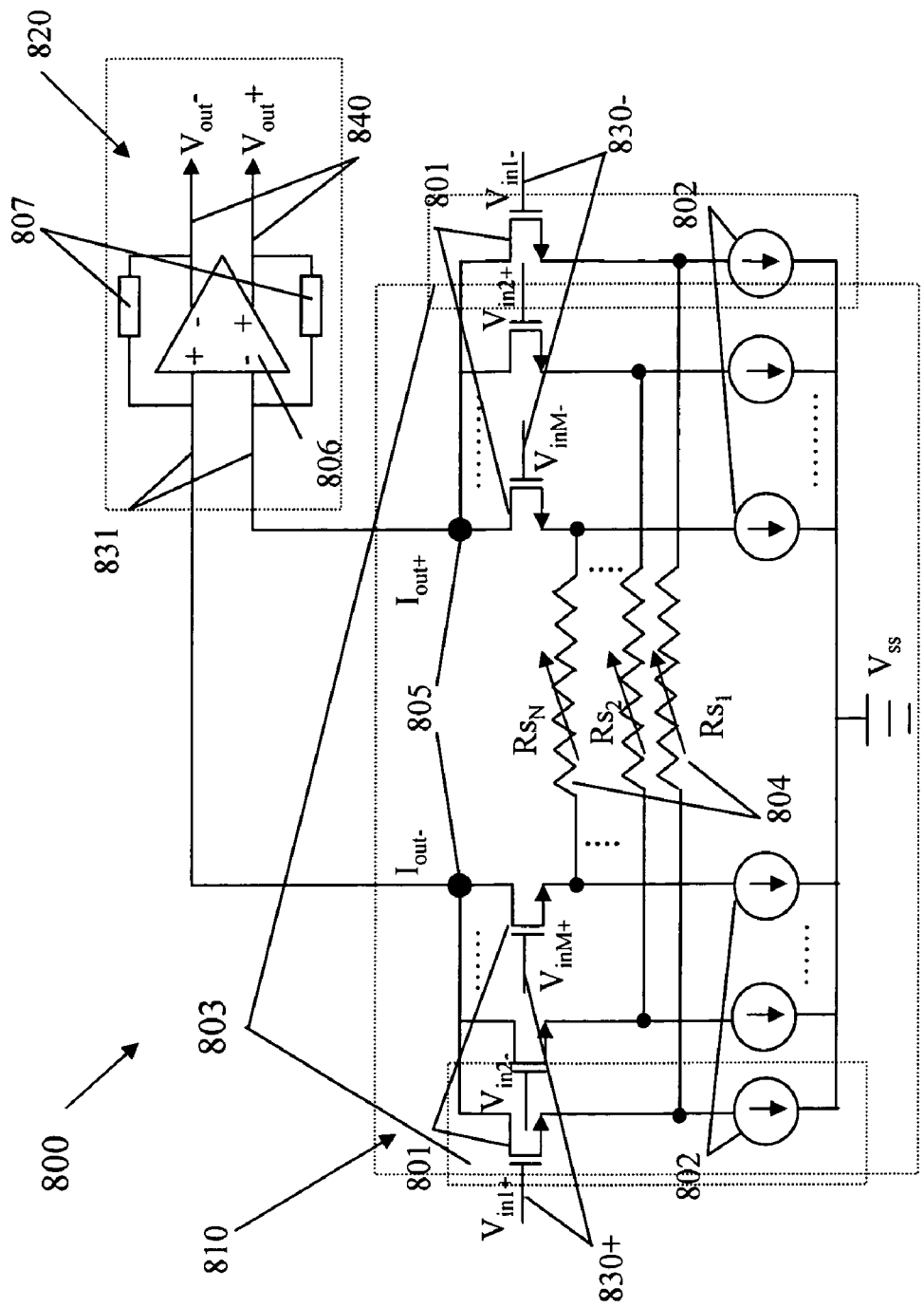
FIG. 8 is a schematic of an example transconductance and transimpedance circuit.

FIG. 8 shows an example schematic of a differential transconductance and transimpedance circuit 800. The differential transconductance and transimpedance circuit 800 comprises a transconductance circuit 810 which is similar to the transconductance circuit 710 shown in FIG. 7, and a transimpedance circuit 820 which can be a transimpedance operational amplifier to replace the load resistors 706 of resistance $R_1$ shown in FIG. 7 to terminate the transconductance circuit 810 and to convert summed differential currents $I_{out}$ at differential node 805 to voltage output signals $V_{out}$ at output terminals of the transimpedance operational amplifier 820, i.e. also output terminals of the transconductance and transimpedance circuit 800. The transimpedance operational amplifier 820 can include an operational amplifier 806 configured into a feedback system with feedback impedances 807. The transimpedance amplifier 820 can further be configured to provide additional filtering function to attenuate unwanted signals such as noises. Similarly, the transimpedance operational amplifier 820 can also replace the load resistors 606 shown in FIG. 6 for a pseudo-differential analor IIR or FIR filters. The transconductance circuit 810 can be fixed, programmable or adaptive. In some implementations, feedback impedance 807 can be configured to be programmable or adaptive for a programmable or an adaptive transimpedance amplifier 820. In some implementations, matching impedances can be coupled to inputs of the transconductance circuit segments 803. In some implementations, matching impedances coupled to inputs of the transconductance circuit segments 803 can be configured to be fixed, programmable or adaptive impedances.

Figure 9:
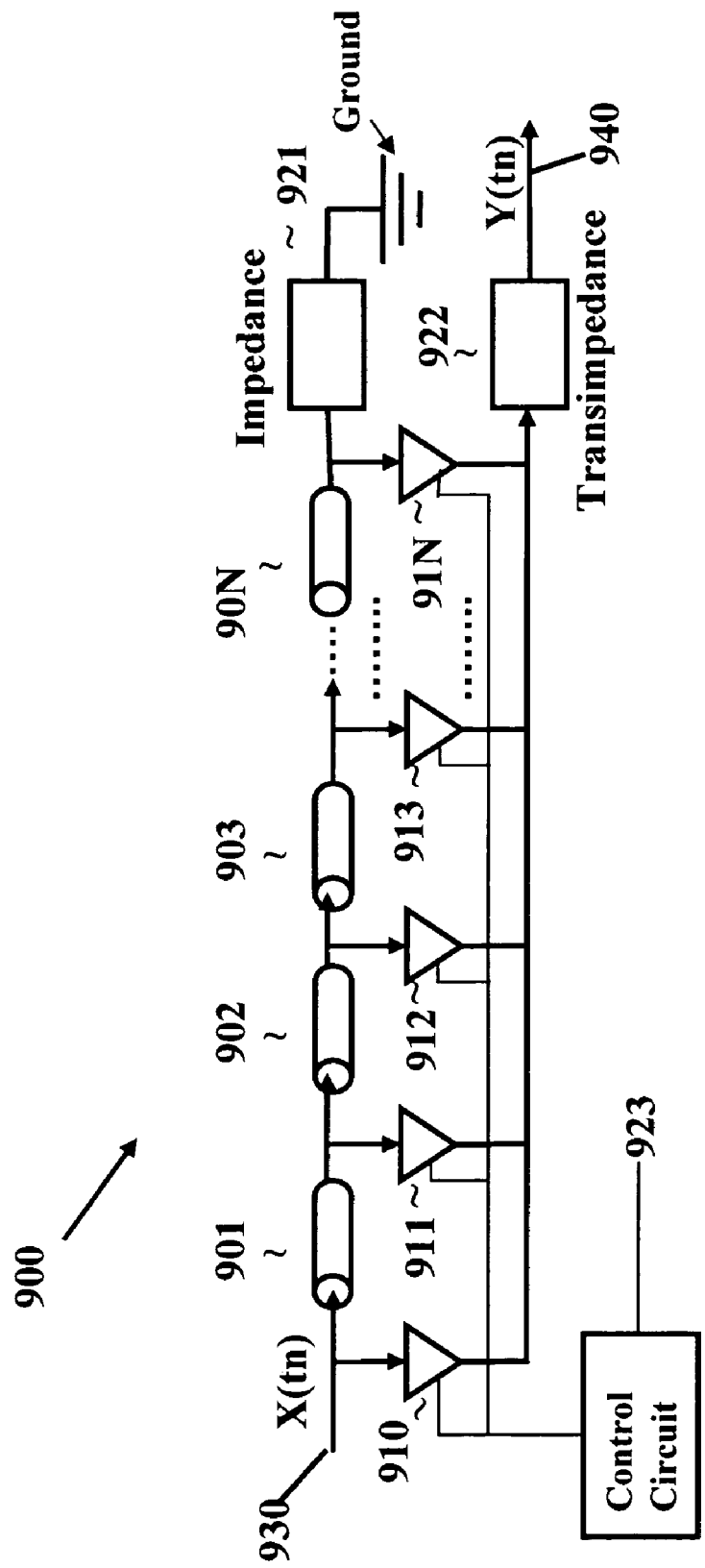
FIG. 9 is a schematic of an example analog filter.

FIG. 9 is a of an example schematic of an analog FIR filter 900. The analog FIR filter 900 is similar to the analog FIR filter 200 except the additional filter control circuit 923. The addition of a control circuit 923 allows the filter to adaptively be changed to compensate for time-varying phenomenon. The control circuit 923 can change the filter response by tuning the filter coefficients, i.e. tuning the transconductances $Gm_0$-$Gm_N$ of the transconductance elements 910-91N. For example, the tunable transconductance elements 910-91N can be configured to include tunable resistor networks 611 or 612 as shown in FIG. 6 for the transconductance and transimpedance circuits 610, 710 or 810 shown in FIG. 6, 7 or 8, respectively. The control circuit 923 can, for example, control the switches $S_1$-$S_l$ to switch corresponding resistors $Rs_{v1}$-$Rs_{vl}$ to increase or decrease the total resistance of the resistor network 611 or 612 shown in FIG. 6, respectively, to tune the corresponding transconductances $Gm_1$-$Gm_N$ therefore the filter coefficients used by the transconductance elements 910-91N according to a system filter response requirement specification.

In some implementations, the control circuit 923 can comprise a switch table for controlling the switches $S_1$-$S_l$ shown in FIG. 6. In some implementations, the control circuit 923 can determine the control of the switches $S_1$-$S_l$ dynamically for an adaptive transconductance circuit using information from the transconductance circuit 910-91N. In some implementations, the control circuit 923 can also control the transimpedance elements 922 and/or the termination impedance 921 for fixed, programmable or adaptive transimpedance and/or termination impedance elements, respectively. In some implementations, matching impedances can be coupled to inputs and/or outputs of the transconductance circuit elements 910-91N. In some implementations, matching impedances coupled to the inputs and the outptus of the transconductance elements 910-91N can comprise resistors, capacitors, inductors and/or combination networks of resistors, capacitors, inductors and/or combination networks of at least two types of resistors, capacitors, and inductors; and can be configured to be fixed, programmable or adaptive impedances.

In some implementations, the input signal X(tn) and the output signal Y(tn) can be single ended. In some implementations, the input signal X(tn) can be single ended but the output signal Y(tn) can be differential. In other implementations, both the input and output signals are differential. In some implementations, additional switches can be employed to add or remove delay elements and corresponding transcnductance elements for more programmability of the analog filters.

Figure 10:
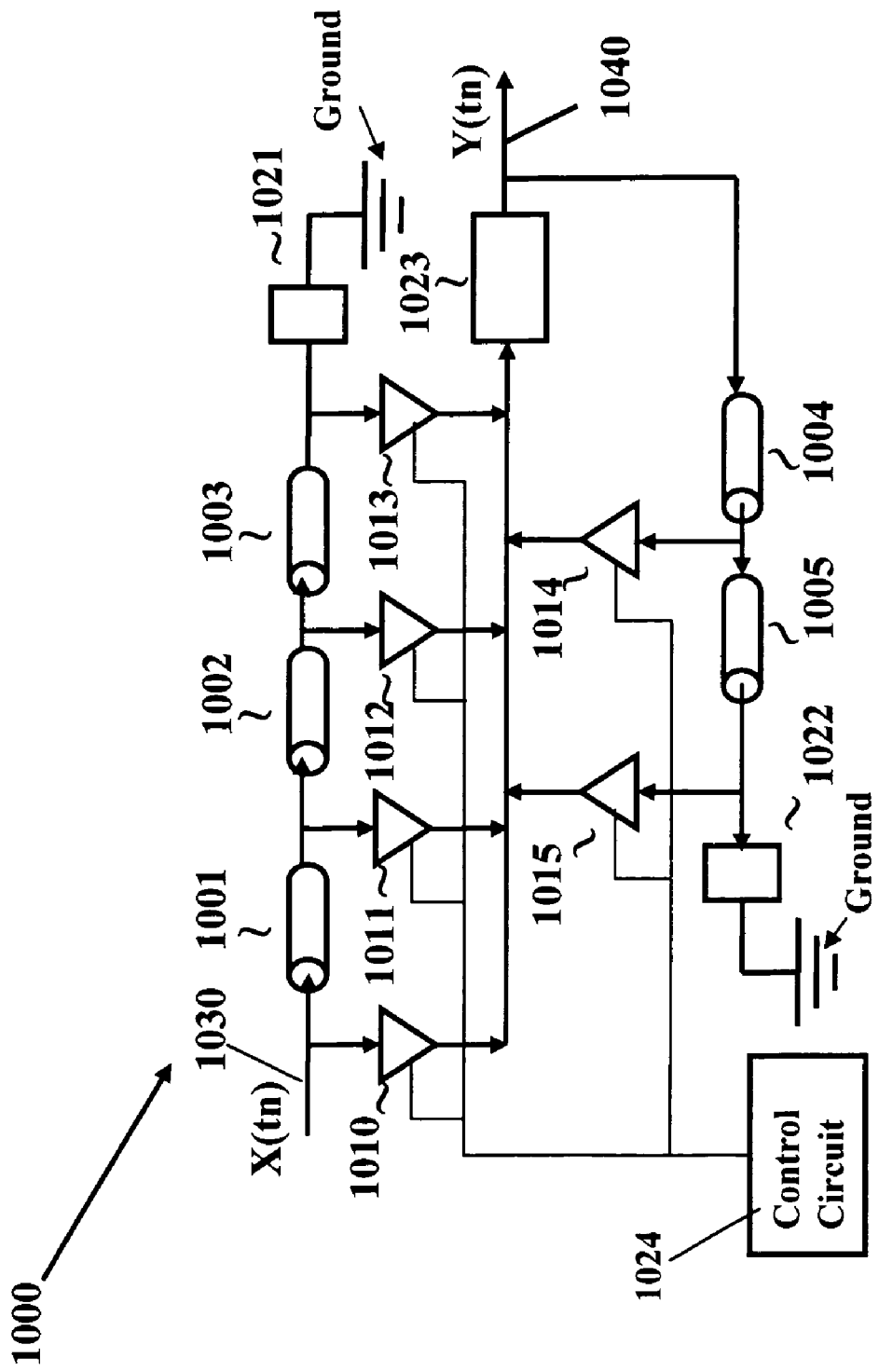
FIG. 10 is a schematic of an example analog filter.

FIG. 10 is a schematic of an example 5-tap analog IIR filter 1000 for a single ended input signal X(tn). The analog IIR filter 1000 is similar to the analog IIR filter 300 except the additional control circuit 1024 which is similar to the control circuit 923 shown in FIG. 9. Similarly, the filter coefficients for the transconductance elements 1010-1015 can be tuned by the control circuit 1024 by switching $S_1$-$S_l$ to switch corresponding resistors $Rs_{v1}$-$Rs_{vl}$ in the resistor network 611 or 612 shown in FIG. 6 to tune transconductors $Gm_0$-$Gm_5$ of corresponding transconductance elements 1010-1015.

In some implementations, the control circuit 1024 can comprise a switch table for controlling the switches $S_1$–$S_j$ shown in FIG. 6. In some implementations, the control circuit 1024 can determine the control of the switches $S_1$–$S_j$ dynamically for an adaptive transconductance elements 1010-1015. In some implementations, additional switches can be employed to add or remove delay elements and corresponding transconductance elements for more programmability of the analog filters. In some implementations, the control circuit can also control the transimpedance elements 1023 and/or the termination impedance elements 1021 and 1022 for fixed, programmable or adaptive transimpedance and/or termination impedance elements, respectively. In some implementations, matching impedances can be coupled to inputs and/or outputs of the transconductance elements 1010-1015. In some implementations, matching impedances coupled to the inputs and/or the of the transconductance elements 1010-1015 can comprise resistors, capacitors, inductors and/or combination networks of resistors, capacitors, inductors and/or combination networks of at least two types of resistors, capacitors, and inductors; and can be configured to be fixed, programmable or adaptive impedances.

Figure 11:
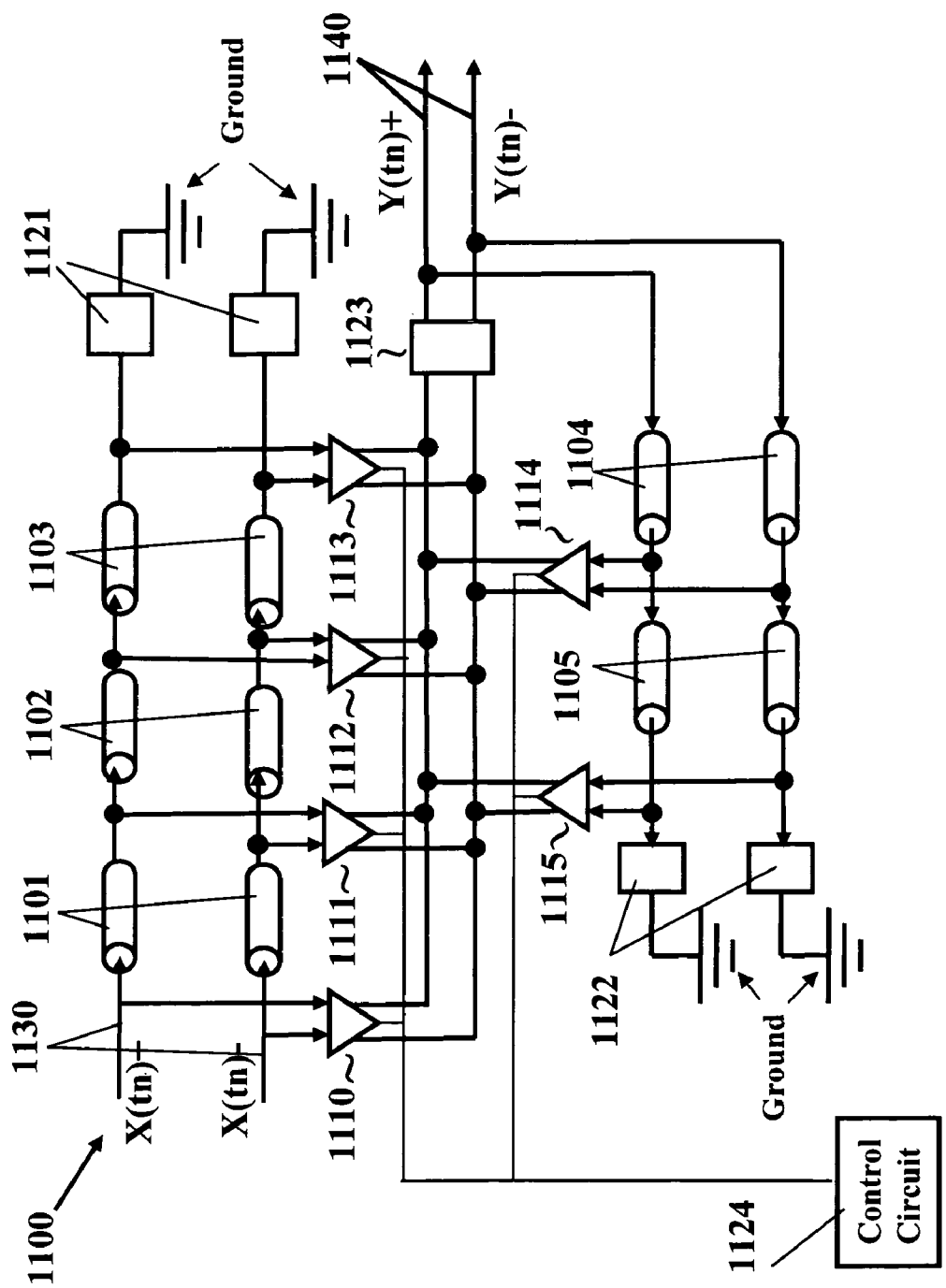
FIG. 11 is a schematic of an example analog filter.

FIG. 11 is a schematic of an example full differential 5-tap analog IIR filter 1100 with differential input signals X(tn). The differential analog IIR filter 1100 is similar to the analog IIR filter 500 shown in FIG. 5 except the additional control circuit 1124 which is similar to the control circuit 1124 shown in FIG. 1100. Similarly, the filter coefficients for the differential transconductance elements 1110-1115 can be tuned by the control circuit 1124 by switching $S_1$–$S_j$ to switch corresponding resistors $Rs_{v1}$–$Rs_{vj}$ in the resistor network 611 or 612 shown in FIG. 6 to tune transconductors $Gm_0$–$Gm_5$ of corresponding transconductance elements 1110-1115.

In some implementations, the control circuit 1124 can comprise a switch table for controlling the switches $S_1$–$S_j$ shown in FIG. 6. In some implementations, the control circuit 1124 can determine the control of the switches $S_1$–$S_j$ shown in FIG. 6 dynamically. In some implementations, additional switches can be employed to add or remove delay elements and corresponding transcnductance elements for more programmability of the analog filters. In some implementations, matching impedances can be coupled to inputs of the transconductance elements 1110-1115. In some implementations, matching impedances can be coupled to inputs of the transconductance elements 1110-1115. In some implementations, matching impedances coupled to inputs of the transconductance elements 1110-1115 can be fixed, programmable or adaptive. In some implementations, the transimpedance element 1123 and/or the termination impedances 1121 and 1122 can be fixed, programmable or adaptive.

Figure 12:
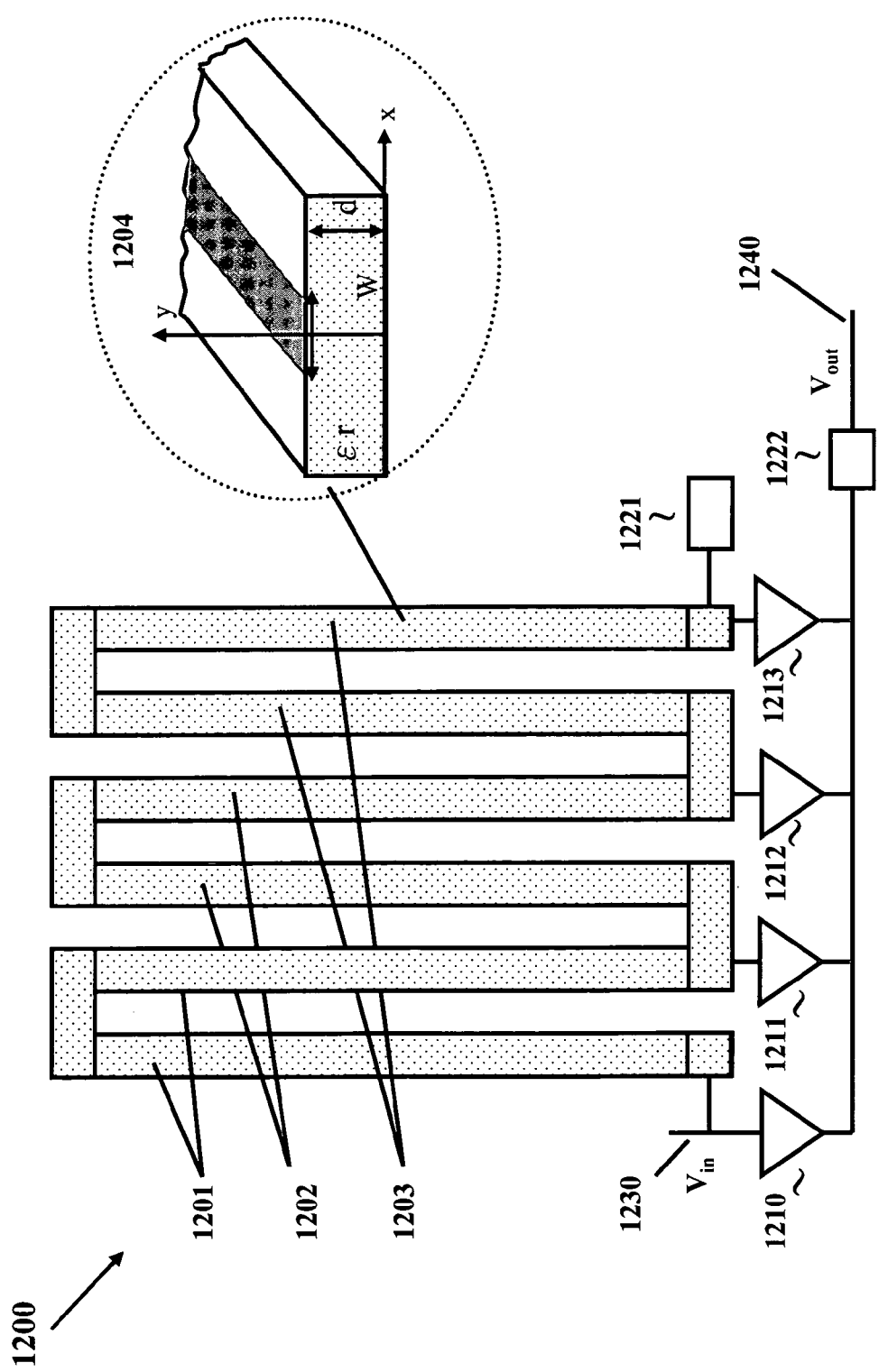
FIG. 12 is a floor plan of an example transmission line delay element layout.

FIG. 12 shows a floor plan of an example 3-tap analog FIR filter 1200 with a single transmission delay line chip layout using a snaked configuration to reduce chip area. The analog FIR filter 1200 is similar to the analog FIR filter 200 for the tap number N=3. The transmission line delay elements. The transmission line delay elements can be, for example, configured in the snaked structure 1201-1203 for a microstrip 1204 which is a planar transmission line structure. The lossless unit characteristic impedance $Z_o$ can be a function of an effective dielectric constant $\in_e$ and geometry dimensions of the microstip line 1204, i.e. $Z_o = f(W,d)/\in_e^{1/2}$, wherein W is the width and d is the depth of the microstrip line 1204. The microstrip 1204 can be particularly useful for implementing an analog IIR or FIR filters in an integrated circuit. In some implementations, a coaxial line, a two-wire line, a plate line such as a stripline, a microstrip or a plate waveguide, bond wire, printed circuit board, can be used to implement the delay elements. A delay time td of a transmission line delay element can be designed using the characteristic impedance and according to a system filter requirement specification.

Figure 13:
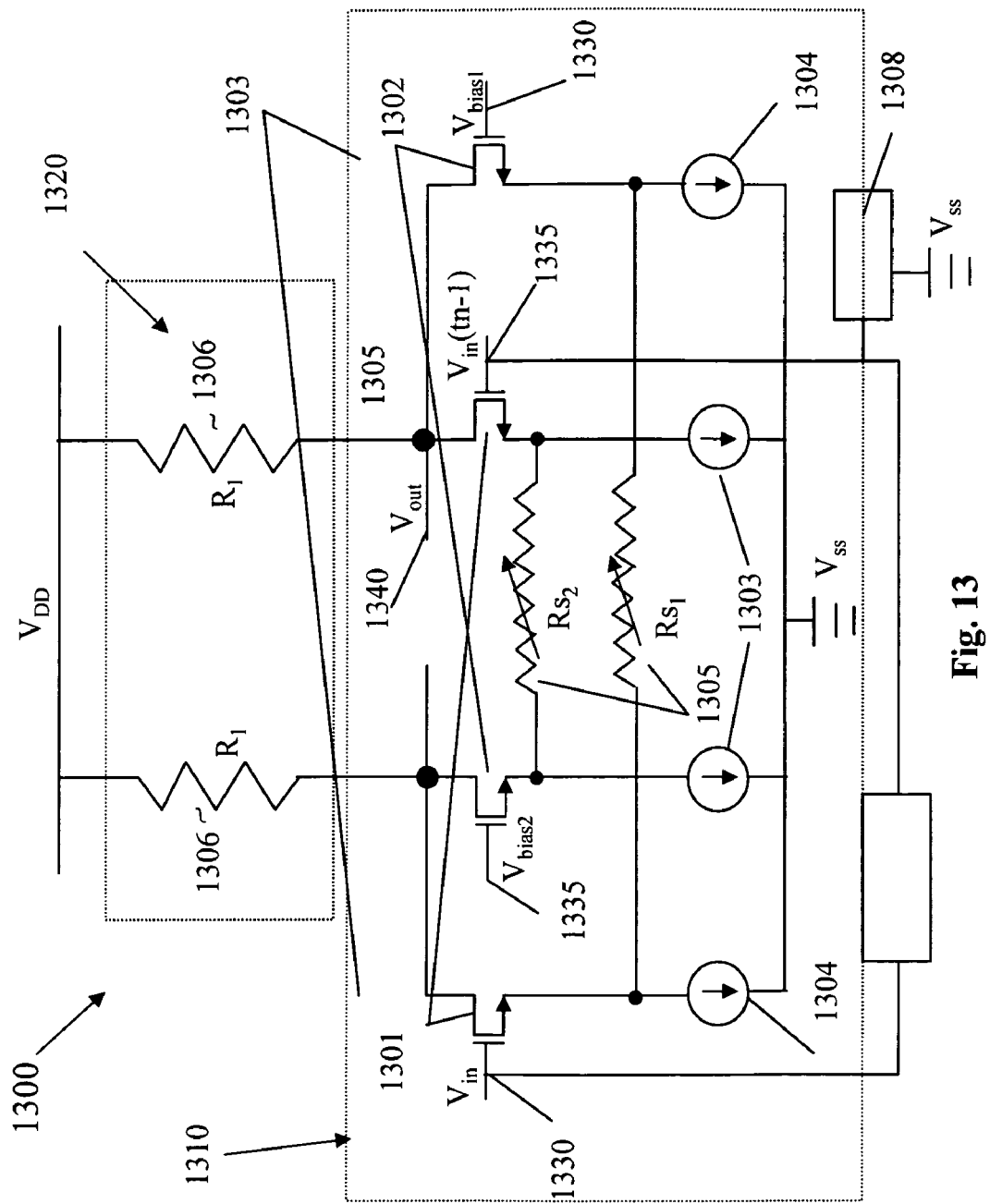
FIG. 13 is a schematic of an example analog equalizer circuit.

FIG. 13 shows a schematic of an example analog equalizer circuit 1300 employing analog filter techniques described above. The analog equalizer circuit 1300 can be a 1-tap FIR filter and comprises two differential transconductance elements 1310, a transimpedance element 1320 including a load resistor R 1306, a transmission delay element 1307, a termination impedance 1308, an input terminal 1330 and an output terminal 1340. The transconductance element 1320 can further comprise a differential transistor pairs 301 and 302, differential current source pairs 303 and 304, and variable resistor networks $Rs_1$–$Rs_3$. The analog equalizer 1300 circuit can be configured to represent a FIR filter equation (4) of $V_{out}(tn) = a(n,1)*V_{in}(tn) + a(n-1,2)*V_{in}(tn-1)$ wherein $V_{in}(tn)$ and $V_{out}(tn)$ are single ended input and output signals, respectively, $V_{in}(tn-1)$ is a time-delayed input signal, a(n,1) can have a positive value and a(n,2) can have a negative value. Using the disclosed techniques described above, the input signal $V_{in}(tn)$ can couple to a positive input terminal of 1330 the time-delayed input signal $V_{in}(tn-1)$ cross coupled to a negative input terminal of 1335. The output signal $V_{out}(tn)$ can perform filtering function described in the filter equation (4) which can represent a differentiator or an analog high pass filter. This analog high pass filter for the filter equation (4), i.e. the analog equalizer 1300, can be used as an equalizer to equalize a signal degraded as filtered by a low pass filter.

Figure 14:
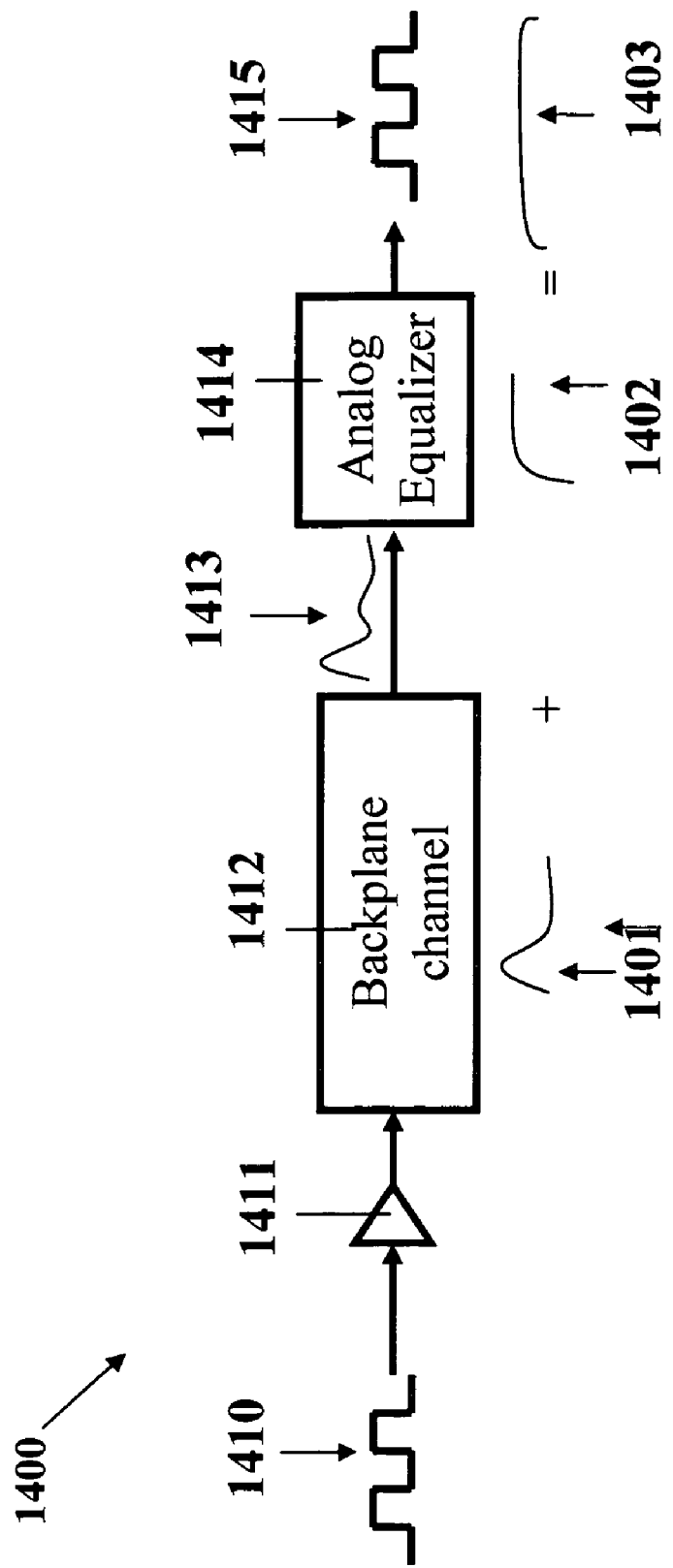
FIG. 14 is a schematic of an example backplane system.

FIG. 14 shows a diagram of an example of an equalized high speed backplane system 1400. The backplane channel 1412 can act like a low pass filter 1401. A transmit signal 1410 can be buffered by a buffer 1411 then can propagate through a backplane 1412 which can degrade the transmitted signal with a low pass filtering function into a degraded signal 1413. An analog receive equalizer 1414 can use a high pass filter 1402 such as the analog equalizer circuit 1300 shown in FIG. 13 to equalize the backplane low pass filter 1401 into a all pass filter 1403 and to restore the degraded signal 1413 to the transmit signal 1410.

In some implementations, the analog equalizer 1414 can be single ended. In some implementations, the analog equalizer 1414 can be differential. In some implementations, the analog equalizer can be fixed. In some implementations, the analog equalizer can be programmable or adaptively controlled. In some implementations, the analog equalizer 1414 can be replaced at the receiving side of the backplane as a receive equalizer. In other implementations, the analog equalizer can be a transmit equalizer. However, the receive equalizer can provide better equalization functions than the transmit equalizer.

The analog IIR and FIR filters using techniques of this disclosure can be implemented for low-pass, high-pass, notch, band-pass and/or band-stop filters or equalizers with very good linearity in high speed system for frequencies around 1 GHz to above 100 GHz, for example, applications in high speed backplanes, disk drives, optical systems, video systems, wireline and wireless communication systems. These and other implementations can optionally include one or more of the following features. The system can include any combination of one or more components for receivers, transmitters, and transceivers, in which an analog IIR or FIR filter can be coupled to any of the one or more components or their sub-components. Control circuits may include a digital circuit or a microprocessor. Any of the methods, designs, and techniques described herein can also be implemented in a system, an apparatus, a printed circuit board, a circuit, device, a machine, or in any combination thereof.

In some implementations, the positions of switches, resistors, or other components can be exchanged from the disclosed figures with minimal change in circuit functionality. Various topologies for circuit models can also be used, other than what is shown in the figures. The exemplary designs shown are not limited to CMOS process technology, but may also use other process technologies, such as BiCMOS (Bipolar-CMOS) process technology, or Silicon Germanium (SiGe) technology. In some implementations, switches can be implemented as transmission gate switches. The circuits can be single-ended or fully-differential circuits.

Those skilled in the art will recognize that certain modifications to the intended patent are intended to be within the scope of this patent. These include additional components added to the inputs of the transconductance amplifiers to improve input matching. Those skilled in the art will also recognize that the invention does not depend on the type of transmission line, or if it is implemented on the chip substrate, the package substrate, or the printed circuit board. Those skilled in the art will also recognize that there are many variations of transconductance and transimpedance amplifiers, and that there can be multiple stages of amplification and conversions between voltage and current that are intended to be within the scope of this patent. Those skilled in the art will recognize that other embodiments that utilize the transmission line as a delay element in their filters, including finite impulse response (FIR) or infinite impulse response (IIR) filters, or feed-forward equalization (FFE) filters or decision feedback equalization (DFE) filters, are intended to be within the scope of this patent. These and other modifications, which are obvious to those skilled in the art, are intended to be included within the scope of the present invention. Other implementations are within the scope of the following claims.

The invention claimed is:

1. A circuit of a continuous-time filter comprises:
an input signal coupled to a forward transconductance element configured to multiply the input signal by a forward filter coefficient to convert the input signal to a filtered input current;
a forward transimpedance element coupled to the forward transconductance element and configured to convert the filtered input current to a filtered voltage;
a forward transmission delay line configured to have a transmission line delay element with a corresponding delay-time and coupled to the forward transimpedance element to delay the filtered voltage to a filtered output signal;
a termination impedance coupled to an output of the forward transmission delay line and configured to terminate the forward transmission delay line;
a feedback transconductance element coupled to the forward transmission delay line and configured to multiply the filtered output signal by a feedback filter coefficient to convert the filtered output signal to a feedback current; and
an output of the feedback transconductance element coupled back to an input of the forward transimpedance to add the feedback current into the filtered input current.

2. The circuit of claim 1 wherein the input signal is single ended or differential and the output voltage signal is single ended or differential.

3. The circuit of claim 1 wherein the said transmission line delay element configured as a waveguide, a microstrip line, a stripline transmission line, a coaxial line or a two-wire line are implemented on an integrated circuit device, off an integrated circuit chip, on a semiconductor substrate, on a package substrate or on a printed circuit board (PCB).

4. The circuit of claim 1 wherein each of the said transmission line delay elements has a fixed or a programmable delay time.

5. The circuit of claim 1 wherein the transmission delay line comprises a fixed or programmable number of transmission line delay elements.

6. The circuit of claim 1 wherein each of the forward transconductance element and the feedback transconductance elements is configured as a transconductance amplifier, as a multistage voltage amplifier, resistors, or a combination of resistors and voltage amplifiers.

7. The circuit of claim 1 wherein each of the forward transconductance element and the feedback transconductance elements is configured to have a fixed value, a programmable value, or an adaptively controlled value.

8. The circuit of claim 1 wherein the termination impedance is configured to have a matched or mismatched impedance in response to a system filter requirement specification.

9. The circuit of claim 1 wherein the transimpedance element comprises a transimpedance amplifier configured for a fixed transimpedance, a programmable transimpedance, or an adaptively controlled transimpedance.

10. The circuit of claim 1 further comprises input matching impedance elements configured for matching to the corresponding inputs of the said transconductance elements.

11. The circuit of claim 1 wherein the analog filter is configured as an infinite impulse response (IIR) filter for equalizing an input signal in disk drives, optical, serial chip-to-chip, serial backplane high speed networks, or radio frequency communication systems.

* * * * *